US011001922B2

(12) United States Patent
Barbee et al.

(10) Patent No.: US 11,001,922 B2
(45) Date of Patent: May 11, 2021

(54) CARBON BASED COATINGS AND METHODS OF PRODUCING THE SAME

(71) Applicant: UNITED PROTECTIVE TECHNOLOGIES, Locust, NC (US)

(72) Inventors: Brent William Barbee, Stanfield, NC (US); Jordan Moriah Larson, Troy, NC (US); Michael Raymond Greenwald, Matthews, NC (US); Christopher Shane Alexander, Albemarle, NC (US); Matthew James Decourcelle, Oakboro, NC (US); Jamey Tollfeldt Ewing, Concord, NC (US)

(73) Assignee: United Protective Technologies, LLC, Locust, NC (US)

( * ) Notice: Subject to any disclaimer, the term of this patent is extended or adjusted under 35 U.S.C. 154(b) by 724 days.

(21) Appl. No.: 14/357,554

(22) PCT Filed: Nov. 17, 2012

(86) PCT No.: PCT/US2012/065726
§ 371 (c)(1),
(2) Date: May 9, 2014

(87) PCT Pub. No.: WO2013/075061
PCT Pub. Date: May 23, 2013

(65) Prior Publication Data
US 2015/0099123 A1    Apr. 9, 2015

Related U.S. Application Data

(60) Provisional application No. 61/577,465, filed on Dec. 19, 2011, provisional application No. 61/630,006,
(Continued)

(51) Int. Cl.
*B32B 9/00* (2006.01)
*C23C 16/26* (2006.01)
(Continued)

(52) U.S. Cl.
CPC .......... *C23C 16/26* (2013.01); *C23C 16/0227* (2013.01); *C23C 16/0245* (2013.01);
(Continued)

(58) Field of Classification Search
CPC ........ B32B 9/007; Y10T 428/30; B82Y 30/00
(Continued)

(56) References Cited

U.S. PATENT DOCUMENTS 6,086,730 A * 7/2000 Liu .................... C23C 14/0605
204/192.12
2007/0134436 A1 6/2007 Kolpakov et al.
(Continued)

FOREIGN PATENT DOCUMENTS

JP    2001-261318 A    9/2001
JP    2004-217977 A    8/2004
JP    2009-185336 A    8/2009

OTHER PUBLICATIONS

Han, Stress, mechanical and adhesion properties of multilayer tetrahedral amorphous carbon films, Applied Surface Science 255 (2008) 607-609.*
(Continued)

*Primary Examiner* — Daniel H Miller
(74) *Attorney, Agent, or Firm* — Moore & Van Allen PLLC; Henry B. Ward, III

(57) ABSTRACT

Provided herein is a carbon based coating and methods of producing the same. The carbon based coating comprising an amorphous carbon thin film deposited on a substrate, the carbon based coating characterized in that the carbon based coating imparts enhanced surface durability properties.

10 Claims, 20 Drawing Sheets

Related U.S. Application Data filed on Dec. 2, 2011, provisional application No. 61/561,104, filed on Nov. 17, 2011.

(51) Int. Cl.
  *C23C 16/50* (2006.01)
  *C23C 16/02* (2006.01)

(52) U.S. Cl.
  CPC .............. *C23C 16/50* (2013.01); *B32B 9/007* (2013.01); *Y10T 428/30* (2015.01)

(58) Field of Classification Search
  USPC .......................... 428/408; 423/447.1; 427/29
  See application file for complete search history.

(56) References Cited

U.S. PATENT DOCUMENTS

| | | |
|---|---|---|
| 2008/0220257 A1 | 9/2008 | Dekempeneer |
| 2010/0206553 A1* | 8/2010 | Bailey ................... E21B 17/042 166/244.1 |

OTHER PUBLICATIONS

International Search Report of correspinding PCT Application No. PCT/US2012/065726; dated Feb. 25, 2013; 4 pages.

* cited by examiner

CARBON BASED COATINGS AND METHODS OF PRODUCING THE SAME

This application claims priority from U.S. provisional patent application Ser. No. 61/561,104, filed 17 Nov. 2011, U.S. provisional patent application Ser. No. 61/630,006, filed on 2 Dec. 2011, and U.S. provisional patent application Ser. No. 61/577,465, filed on 19 Dec. 2011, the entire disclosures of which are hereby incorporated herein by reference.

BACKGROUND

Surfaces that require precision tolerance and/or that are subjected to high contact stresses under dry or starved lubrication conditions often require surfaces that are durable. Wear improvements for such surfaces have traditionally been limited to anodizing and plating operations. These processes can be environmentally hazardous and produce surface having dimensional inconsistencies, limited adhesion, and non-uniform thickness across complex geometries. Further such surfaces cannot maintain high tolerances and, when in dry contact with a static partner, produce aggressive wear and material loss to a mating surface. Moreover, biomedical metallic materials, when used in mechanical interfaces such as clamps, screws and threads, tend to have poor tribological performance which leads to limited repositioning, uneven torque parameters, and even stuck or stripped mechanical junctions.

BRIEF SUMMARY

In one embodiment, a carbon based coating is provided. The carbon based coating comprising: an amorphous carbon thin film deposited on a substrate, the carbon based coating characterized in that the carbon based coating has enhanced durability properties.

In a first aspect of the first embodiment, the thin film comprises tetrahedral amorphous carbon.

In a second aspect, alone or in combination with the first aspect of the first embodiment, the thin film comprises multiple layers.

In a third aspect, alone or in combination with any of the previous aspects of the first embodiment, the thin film comprises a first layer and a second layer, wherein each of the first layer and the second layer comprises different levels of amorphous carbon and tetrahedral amorphous carbon.

In a fourth aspect, alone or in combination with any of the previous aspects of the first embodiment, the carbon based coating is characterized in that the carbon based coating has a coefficient of friction values less than 0.10 under steady-state, un-lubricated, and ambient atmospheric conditions.

In a fifth aspect, alone or in combination with any of the previous aspects of the first embodiment, the carbon based coating characterized in that the carbon based coating has a coefficient of friction values less than 0.10 under steady-state, un-lubricated, and ambient atmospheric conditions.

In a sixth aspect, alone or in combination with any of the previous aspects of the first embodiment, wherein the thin film is deposited on the substrate using a plasma assisted chemical vapor deposition process (PACVD), the PACVD process having a processing temperature range from about 19° C. to about 204° C.

In a seventh aspect, alone or in combination with any of the previous aspects of the first embodiment, the carbon based coating characterized in that the carbon based coating has low material loss under high contact loads and a mating surface in contact with the carbon based coating has low material loss under high contact loads as measured in accordance with ASTM G77.

In an eighth aspect, alone or in combination with any of the previous aspects of the first embodiment, the carbon based coating characterized in that the carbon based coating has a coating surface wear rate less than 1.0E-03 mm3/N mm as measured in accordance with ASTM G99 using an aluminum substrate coated with the thin film.

In a ninth aspect, alone or in combination with any of the previous aspects of the first embodiment, the carbon based coating characterized in that the carbon based coating completely delaminates at a critical load value of greater than or equal to 19 N as measured in accordance with ASTM C1624 using an aluminum substrate coated with the carbon based coating.

In a tenth aspect, alone or in combination with any of the previous aspects of the first embodiment, the substrate comprises a metal.

In an eleventh aspect, alone or in combination with any of the previous aspects of the first embodiment, at least a portion of the amorphous carbon thin film is embedded beneath the substrate surface.

In another embodiment, a method of producing a carbon based coating is provided. The method comprising: depositing an amorphous carbon thin film on a substrate, the carbon based coating characterized in that the carbon based coating is hard and durable.

In still another embodiment, a method for producing a carbon based coating on a surface is provided. The method comprising loading a substrate into a deposition chamber; charging a first gas to plasma clean the substrate; and charging a second gas to deposit the carbon based coating on a surface of the substrate, the second gas comprising a carbon based gas.

In a further embodiment, a substrate with a carbon based coating is provided. The carbon based coating produced by loading a substrate into a deposition chamber; charging a first gas to plasma clean the substrate; and charging a second gas to deposit the carbon based coating on a surface of the substrate, the second gas comprising a carbon based gas.

BRIEF DESCRIPTION OF THE SEVERAL VIEWS OF THE DRAWINGS

The present embodiments are further described in the detailed description which follows in reference to the noted plurality of drawings by way of non-limiting examples of the present embodiments in which like reference numerals represent similar parts throughout the several views of the drawings and wherein.

DETAILED DESCRIPTION

The embodiments provided herein are directed to a carbon based coating comprising an amorphous carbon thin film deposited on a substrate. In some embodiments, the thin film is deposited using a low temperature plasma assisted chemical vapor deposition (PACVD) process. In some embodiments, the PACVD process has a processing temperature range from about 19° C. to about 204° C. In other embodiments, the substrate comprises any material that is vacuum stable. Exemplary substrate materials include semi-conductors, polymers and composites, metals, metal alloys, silicon, and the like. Specific examples of the substrate materials include nickel based alloys, cobalt-chrome, stainless steels, acrylic, germanium, titanium alloys, aluminum, carbides, carbon-composites, polyethersulphone, alloy steels, magnesium, polycarbonate, silicon, sapphire, and the like.

In further embodiments, the carbon based thin film comprises amorphous carbon and/or tetrahedral amorphous carbon. In some embodiments, the amorphous carbon comprises $sp^2$ and/or $sp^3$ hybridized bonds. For example, the amorphous carbon may comprise a certain ratio of $sp^2$ to $sp^3$ bonds. In other embodiments, the tetrahedral amorphous carbon comprises a high $sp^3$ bond content. In still other embodiments, the amorphous carbon and/or tetrahedral amorphous carbon comprises nano-crystalline diamond content. In further embodiments, the thin film comprises at least one layer. The thin film can include layers or "zones" that each comprise varying levels of amorphous carbon and/or amorphous tetrahedral carbon. For example, during the PECAVD process, the layers or zones may meld into one another such that the middle portion of one layer can include a different ratio of amorphous carbon to amorphous tetrahedral when the ratio of the one layer is compared to the ratio of carbons in another layer's middle portion.

Figure 7:
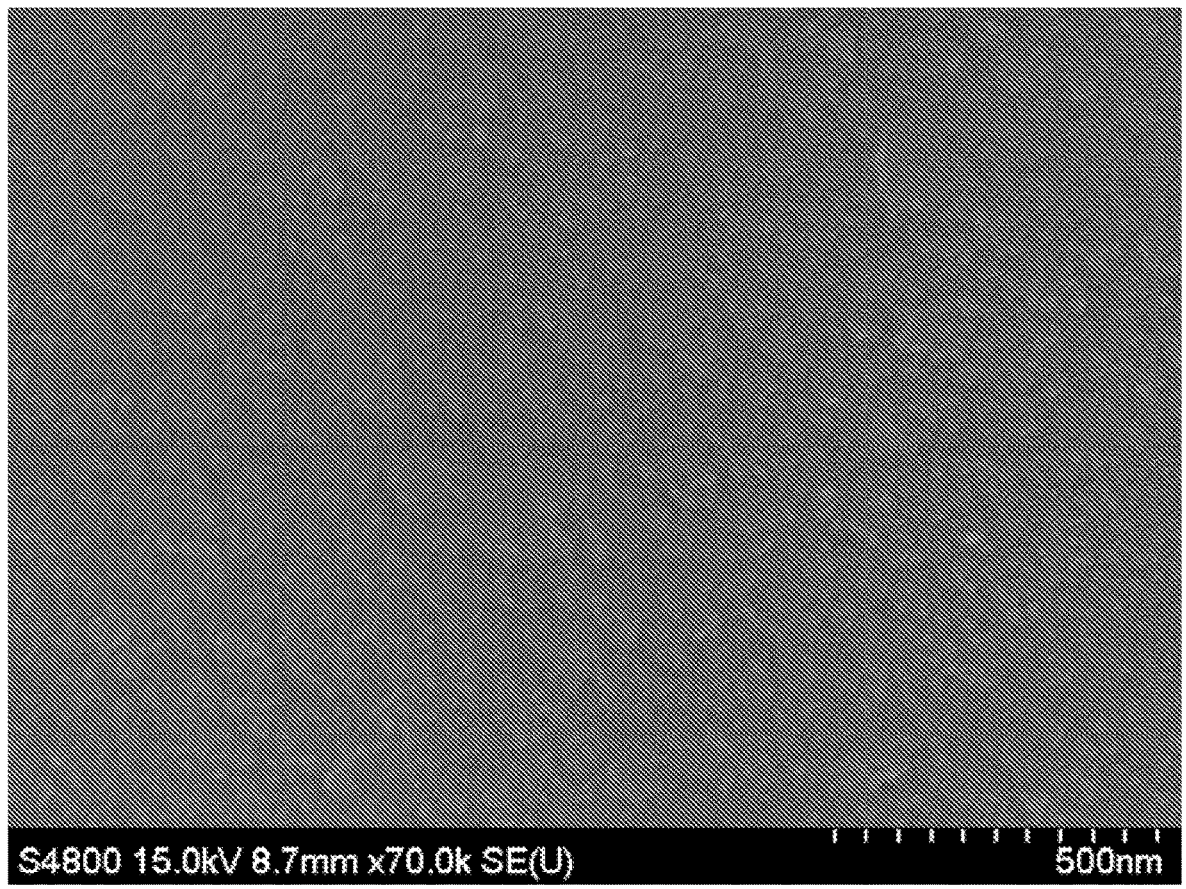
FIG. 7 illustrates a scanned image of a Scanning Electron Microscopy (SEM) image of a carbon based coating surface in accordance with various embodiments.

The carbon based coating offers significant advantages over traditional hard carbon or diamond-like carbon (DLC) coatings due to their unique structure and processing techniques. In some embodiments, the carbon based coating comprises nanocomposite structures that are constructed from multiple hard carbon layers with wide range mechanical properties. These layers, in some embodiments, are comprised of varying levels of glassy amorphous carbon and tetrahedral amorphous carbon content. By building nanocomposite structures with these materials, the carbon based coatings are inherently pinhole free, extremely smooth and can be produced with hardness levels above 60 GPa as measured in accordance with ASTM E2546. A SEM image of the carbon based coating is illustrated in FIG. 7. DLC coatings, on the other hand, are heterogeneous monolithic films comprised of graphitic particles, pinholes, diamond-like structures and hydrocarbon rich areas. Typical harnesses for DLC structures are in the range of 15-30 GPa.

The carbon based coatings are produced with a rate controlled ambient temperature process that does not require interfacial layers for adhesion. This metered process will not distort finished part tolerances or affect the thermal condition of metals. Since the carbon based coating process does not require interfacial coatings, parts can be coated in there finish machined and heat treated form. DLC coating processes are carried out at very high temperatures (typically above 350° C.) and can significantly affect the thermal treatment and dimensional tolerances of a finished part. Interfacial coatings such as Cr or Ni are often applied to substrates prior to coating with DLC in order to promote adhesion to the base substrate (such as steel). All of these factors have the potential to produce rework and scrap, and increase opportunity for coating failures.

Additionally, the surfaces coated with the carbon based coating are resistant to HCl, $HNO_3$, $H_2SO_4$, and salt water. Applications of the carbon based coatings on sliding interfaces improve durability and load carrying capability. The use of the carbon based coatings allows precision machined surfaces to realize fiction and surface hardness modifications that are not possible with alternate coating processes that require interfacial layers or high temperatures. Application of a uniform hard carbon/tetrahedral amorphous carbon coating to precision mating surfaces provide improved surface hardness, a decreased coefficient of friction, and improved corrosion resistance.

Method for Depositing Carbon Based Thin Films

Embodiments directed to a method for depositing carbon based thin films on a wide range of substrate materials are presented herein. A carbon based coating can have multiple practical applications. Carbon films can have an index of refraction value that varies from 1.8-2.4, depending on the allotrope, making them a good anti-reflective coating for infrared transparent materials such as silicon and germanium. An allotrope such as amorphous carbon or diamond will also protect the underlying material from scratching or pitting in abrasive environments. Carbon films also provide low sliding resistance (i.e. friction) due to low surface roughness, high hardness, and chemical inertness. Thus, carbon based films can be applied to sliding interfaces, such as those found in meshing gears, to reduce frictional losses and improve surface durability. The chemical inertness of carbon based films also means that a carbon based film can prevent and/or reduce corrosion of the coated material. As an example, a mild or low alloy steel fastener could be coated with a carbon based film to prevent oxidation/corrosion in highly humid environments.

The wide range of applications for carbon based coatings is due in part to the range of physical properties that can be imparted to the carbon films. That is, by altering the conditions of the deposition process, physical properties of the carbon based thin film can be altered. For example, the carbon source gas used for deposition will affect the hardness of the produced film while other parameters such as gas amount and potential difference will affect growth rates.

Figure 1:
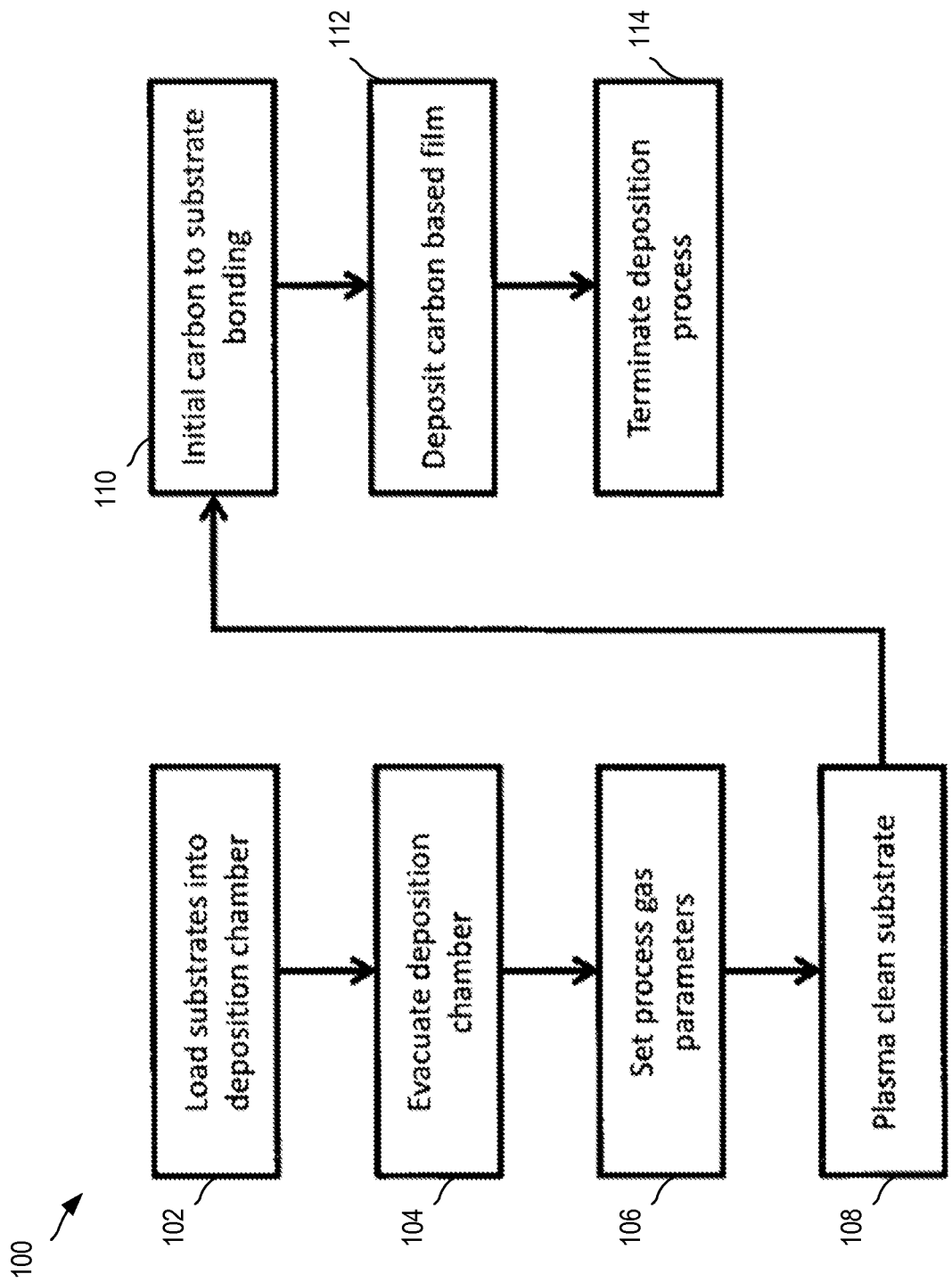
FIG. 1 illustrates a flowchart of a plasma assisted chemical vapor deposition (PACVD) process in accordance with various embodiments.

Referring now to FIG. 1, a plasma assisted chemical vapor deposition (PACVD) process 100 is illustrated. As illustrated at block 102, substrates are loaded into the deposition chamber. This process step involves placing the items to be coated into the deposition chamber in such a manner as to promote the uniform deposition of a carbon based coating to all of the desired surfaces.

As illustrated at block 104, the deposition chamber is evacuated. Prior to deposition of the carbon based coating, the deposition chamber is evacuated to a suitable base pressure. The purpose of evacuating the deposition chamber is to remove unwanted contaminants and create a controlled environment for the deposition of the carbon based film.

Figure 2:
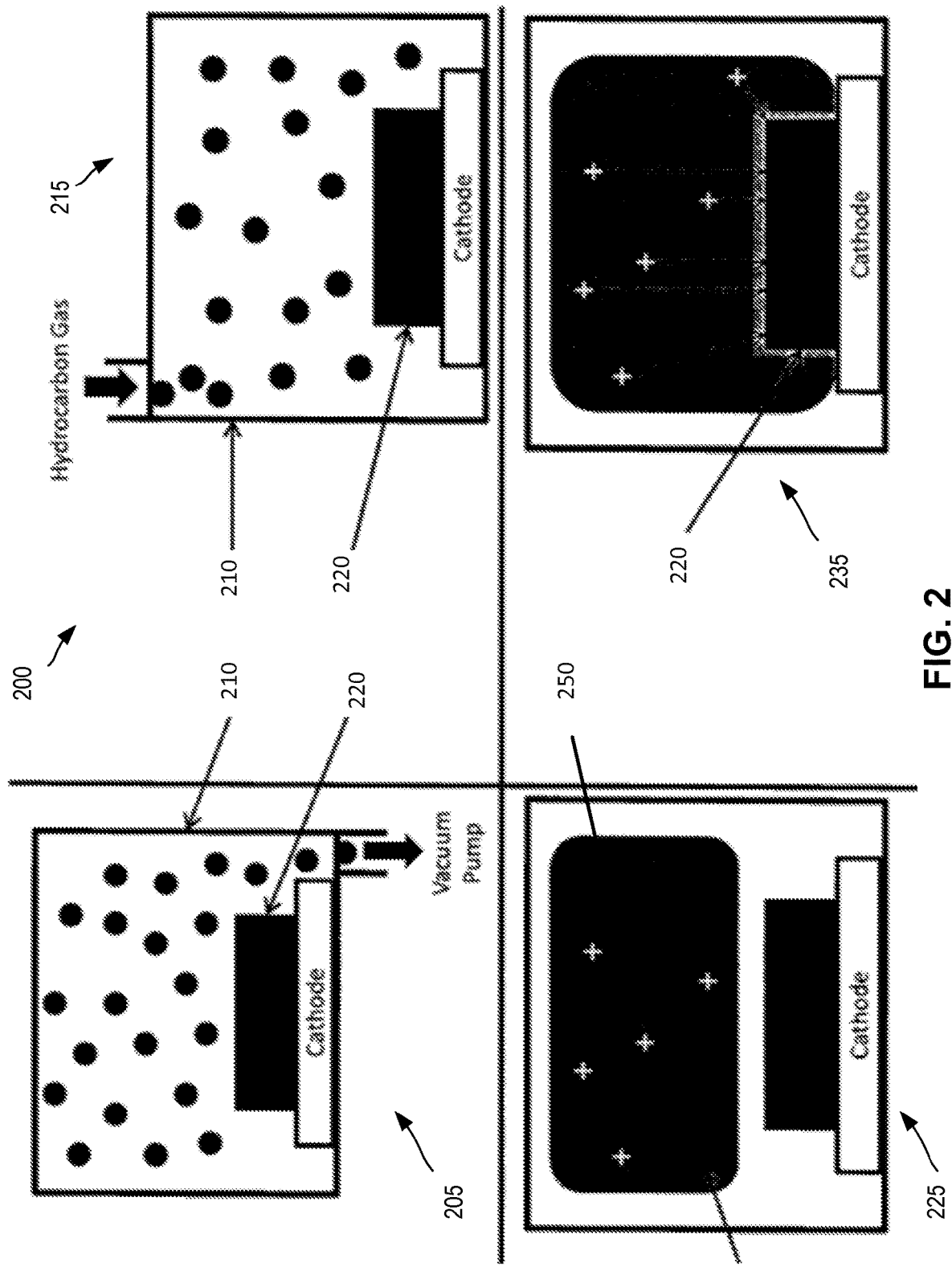
FIG. 2 illustrates a system and environment for carrying out the steps of a PACVD in accordance with various embodiments.

Chamber evacuation is achieved by a two stage pumping system. Pressure in the chamber is reduced from atmospheric pressure (around 760 Torr) to less than 0.100 Torr by means of a rotary vane mechanical pump. It should be noted that other types of "rough" pumps are also be suitable. A high vacuum pump is then used to reduce pressure inside the deposition chamber to a base pressure. Turbomolecular pumps as the high vacuum pumps on deposition systems can be used although other types of pumps are also suitable. In some embodiments, a base pressure range of from about $1.0 \times 10^{-4}$ Torr to about $1.0 \times 10^{-7}$ Torr is provided. In other embodiments, a base pressures range of about $9.0 \times 10^{-5}$ Torr to about $1.0 \times 10^{-6}$ Torr is provided. In still other embodiments, the base pressure is less than $1.0 \times 10^{-5}$ Torr. FIG. 2 illustrates a system and environment 200 for the chemical vapor deposition process. A deposition chamber 210 is evacuated to remove unwanted atmosphere via a vacuum pump at process step 205.

Referring again to FIG. 1, process gas parameters are set as illustrated at block 106. Once a suitable base pressure has been achieved, the desired process gas parameters are set. This step involves selecting the process gases that will be used for deposition, the amount of gas used for deposition, and the turnover rate of the process gas. The process gases used for carbon based film deposition fall into three general categories. In the first category, inert gases are provided. These gases are used to plasma clean the substrate material, as a source of free electrons and to impart energy to the growing film. Possible inert gases include all noble gases in the periodic table with the exception of radon. In some embodiments, neon, argon and/or krypton are used.

The second category includes carbon source gases—these gases are used to supply the carbon that makes up the carbon based coating. Carbon source gases include any carbon bearing compound that is a gas at standard temperature and pressure and that will disassociate or ionize. Exemplary carbon source gases include hydrocarbon, fluorocarbon, ethylene, and/or acetylene carbon source gases. The third category includes gases that can impart specific properties to the carbon based coating, but are not required in all coating formulations. Any compound that is a gas at standard temperature and pressure and that will disassociate or ionize can be used. Exemplary other gases include hydrogen, fluorocarbons, and nitrogen. The desired properties of the coating will dictate which "other gases" provide the best results.

The deposition chamber is continuously evacuated/exhausted during the deposition process. FIG. 2 illustrates a process step 215 where the deposition chamber 210 is backfilled with hydrocarbon gas. The amount of a particular process gas used during the deposition process is expressed by the following: (Process Gas In)–(Process Gas Out)=(Amount of Process Gas). The amount of a process gas introduced into the deposition chamber is controlled by a Mass Flow Controller (MFC) while the amount of process gas removed from the chamber is controlled by the pumping speed of the high vacuum pump (see, FIG. 3). The rate at which gas is introduced into the deposition chamber will reach equilibrium with the rate at which gas is removed from the deposition chamber. This equilibrium is closely related to the turnover rate of the process gas. Turnover rate is a qualitative expression of how long a particular process gas molecule remains in the deposition chamber prior to being evacuated.

The amount of gas used and the turnover rate of the gas can vary depending upon the desired film properties. The range of potential gas amounts and turnover rates used for deposition are essentially infinite. In some embodiments, the amount of process gas used for carbon film deposition is less than about 20 milliTorr. It other embodiments, the amount of process gas ranges from about 1 mTorr to about 200 mTorr.

Referring again to FIG. 1, the substrate is plasma cleaned as illustrated at block 108. This process step is used to prepare the surface of a material to be coated at the microscopic level. In this step, atoms of inert gas described hereinabove are ionized via Radio Frequency (RF) alternating current conducted through the deposition chamber cathode. FIG. 2 illustrates a step 225 where RF power is applied to generate a hydrocarbon plasma 250 from the hydrogen gas to be deposited on a work piece 220. The resulting plasma is a mixture of negatively charged free electrons, positively charged inert gas ions, and neutral gas atoms. By controlling the RF power, a net negative charge (i.e. bias voltage) of variable magnitude is created on the deposition cathode and any material either directly or capacitively coupled to the cathode. Thus, the material to be coated receives this same net negative charge and can therefore be considered to be the cathode for the remainder of this discussion. The negative charge of the cathode attracts the positively charged inert gas ions with a force proportional to the potential difference between the two charges. This attraction causes the inert gas ions to collide with the cathode. During collisions between inert gas ions and the cathode surface, energy can be transferred from the inert gas ions to cathode atoms. Sufficient energy transfer will result in cathode atoms being dislodged from the surface of the cathode. For the purposes of this discussion, it is assumed that dislodged cathode atoms are evacuated through the high vacuum pump and are inconsequential during the remaining process description. This process is commonly referred to as "sputtering". FIG. 2 shows a step 235 where bias voltage is applied to attract carbon ions to the work piece 220. The work piece 220 is negatively biased and because the work piece 220 carries a uniform bias voltage, carbon ions are attracted to all surfaces of the work piece 220.

From the preceding description, it can be determined that with inert gas ions of sufficient energy and given sufficient time, the outermost layer or layers of cathode atoms can be removed to expose underlying layers of cathode atoms. In this manner, the surface of the material to be coated is prepared for deposition because surface contaminants and unreactive layers are removed. Additionally, the removal of atoms from the cathode breaks electron bonds which results in the formation of open electron bonds which become critical in subsequent steps. The range of potential process conditions associated with the plasma cleaning step is essentially infinite. These process conditions include inert gas type, gas amount, gas turnover rate, RF power amount, bias voltage, and/or time. In some embodiments, the range of process conditions associated with the plasma cleaning step are: gas type of neon, argon, and/or krypton; gas amount of about 1.0 mTorr to about 20.0 mTorr; RF power of about 50 W to about 1000 W; bias voltage (bias voltage values are presented as magnitudes but in practice are negative values) from about 200V to about 1200 V; and time from about 5 minutes to about 120 minutes. In other embodiments, the process conditions associated with the plasma cleaning step include argon as the gas type, a gas amount of about 4.0 mTorr to about 10.0 mTorr, an RF power range of about 50 W to about 1000 W, a bias voltage range of about 200V to about 800V, and a time of about 10 minutes to about 30 minutes.

Referring again to FIG. 1, initial carbon to substrate bonding is provided at block 110. After the substrate material has been plasma cleaned, the initial bonding of carbon to the substrate material can commence. This initial bonding of carbon to the substrate material is typically referred to as "Carbon Seeding." This process step can be used for, but not limited to, bare metallic substrates. In some embodiments, the carbon seeding step is performed with plasma comprised solely of a carbon source gas. The carbon seeding step is similar to the plasma cleaning step in that the carbon source gas is ionized by means of RF power transmitted through a cathode (i.e., substrate material). However, since the carbon source gas is made up of molecules and not monatomic species like the inert gas, the resulting plasma has a more complex make up and includes the following: negatively charged free electrons; neutral carbon source gas molecules; positively charged carbon source gas molecules; neutral carbon source gas fragments; positively charged carbon source gas fragments; neutral carbon source gas constituent atoms; positively charged carbon source gas constituent ions. For example, acetylene, represented by the chemical formula C2H2 (two carbon atoms and two hydrogen atoms), can have plasma comprised of free electrons; neutral C2H2 molecules; ionized C2H2 molecules; neutral CH, C2H, CH2, C2, etc. molecules; ionized CH, C2H, CH2, C2, etc. molecules; neutral C or H atoms and/or ionized C or H atoms.

As with the plasma cleaning step, the positively charged or ionized species of the carbon source gas plasma will be attracted to the negatively charged cathode and by extension the substrate to be coated. While the amount or type of each charged species that makes it to the surface of the cathode is unknown, it is known that charged carbon and hydrogen make it to the cathode surface.

During the prior plasma cleaning step, open bonding sites were created on the surface of the cathode by the removal of surface layer atoms. These open bonding sites now become attachment points for the initial ionized carbon source gas species. If the potential difference between the ionized species and the cathode is great enough, there is a chance that the ionized species will hit the cathode with enough force to penetrate and become implanted below the surface.

Figure 4:
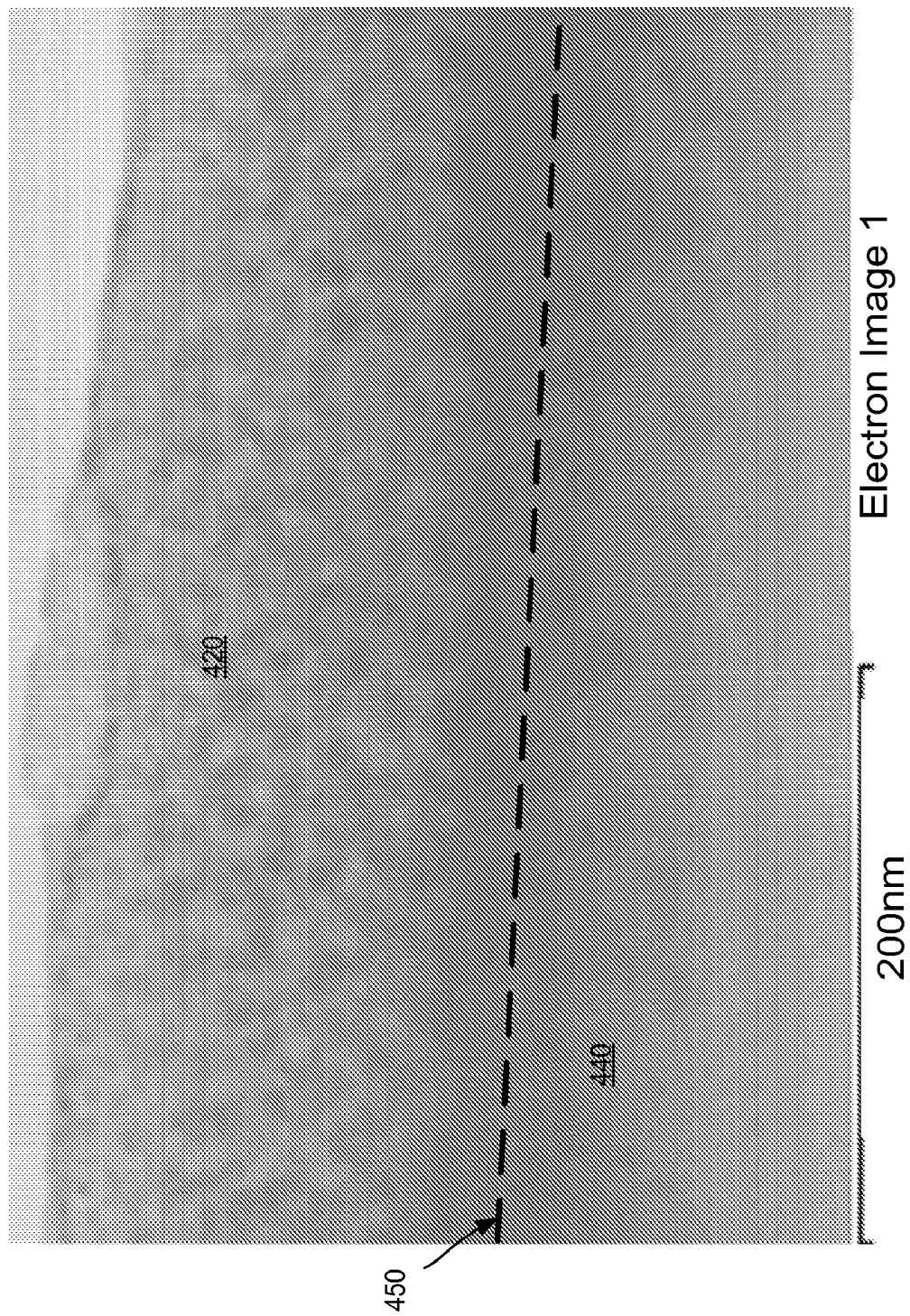
FIG. 4 illustrates an electron image of a cross section of a coated substrate in accordance with various embodiments.

Experiments were conducted to show species implanted below the substrate surface. Scanning transmission electron microscopy (STEM) was performed on a silicon wafer coated by deposition with the carbon based coating that was cut so that a cross-section of the sample could be examined. Using energy dispersive X-ray spectroscopy (EDS), the chemical composition of the sample could be analyzed and the location of carbon and silicon atoms tracked. FIG. 4 illustrates an electron image of the sample cross-section with the carbon film and silicon substrate labeled. As shown in FIG. 4, a carbon based thin film 420 coats a surface 450 (represented by a dotted line), of a silicon substrate 440.

Figure 5:
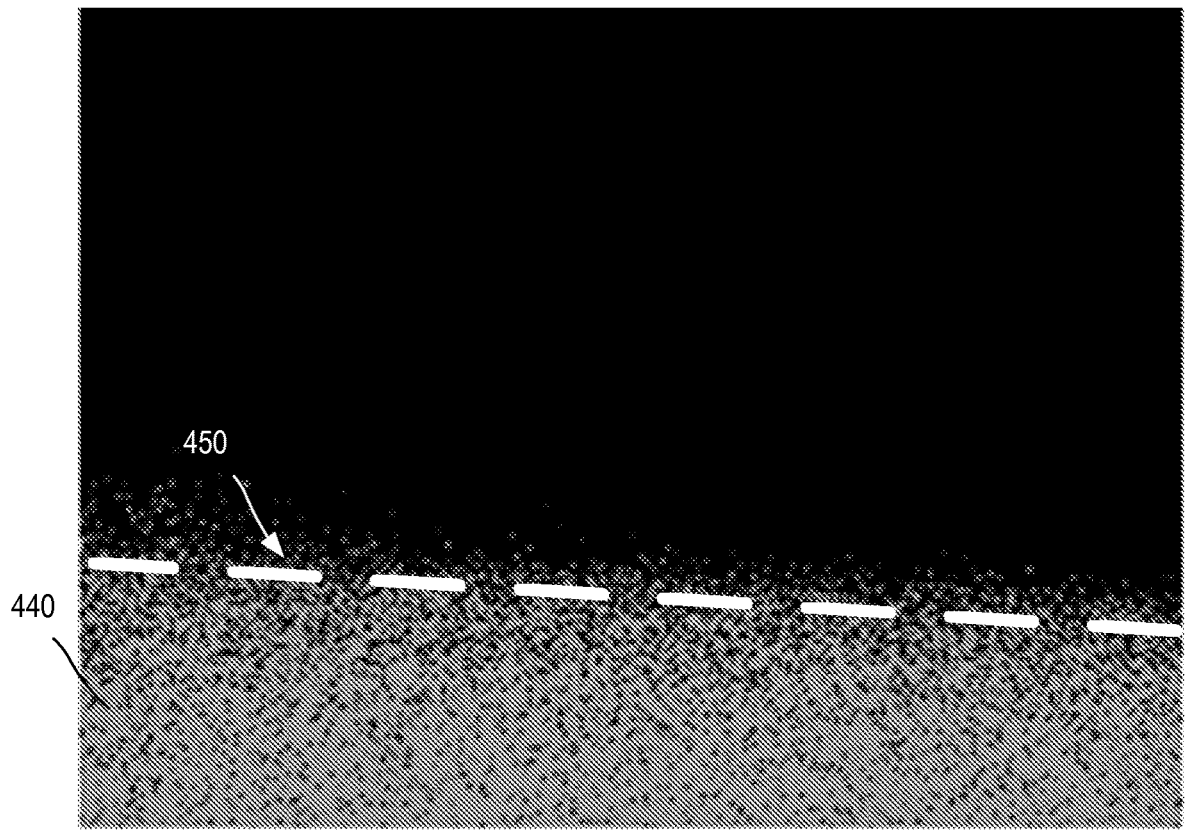
FIG. 5 illustrates an energy dispersive x-ray spectroscopy (EDS) map of the image in FIG. 4 in accordance with various embodiments.
Figure 6:
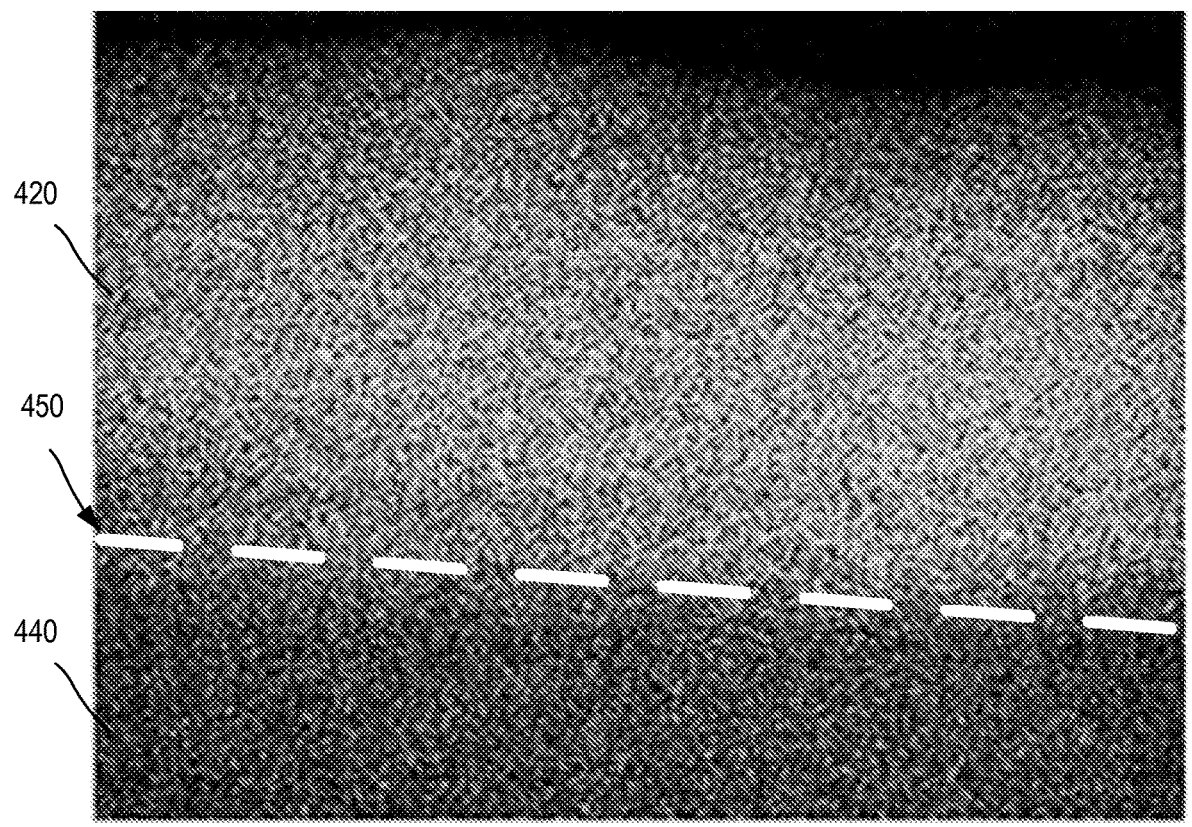
FIG. 6 illustrates an energy dispersive x-ray spectroscopy (EDS) map of the image in FIG. 4 in accordance with various embodiments.

The images presented in FIGS. 5-6 are the EDS maps of the image in FIG. 4. The EDS maps are used to show the location of carbon and silicon in the sample. The EDS maps show a clear boundary for the silicon (FIG. 5) at the surface 450 of the substrate 440. The carbon (FIG. 6) is present not only above the surface 450 of the silicon substrate 440, but also below the surface 450 of the silicon substrate 440 as a result of carbon ion implantation during the second step of the PECVD process. Although a silicon substrate is illustrated, it will be understood that other substrates can be used to show the embedding of the species as described herein.

The depth of the implanted carbon in FIGS. 4-6 is approximately 100-200 nanometers with the thickness of the carbon based coating being about 200 nm. The implantation depth of carbon during the carbon based coating deposition process is a function of the bias voltage applied to the work piece. Higher bias voltages create a larger electric potential difference which increases the speed and thus force with which the carbon ions strike the work piece. Implantation depth is therefore primarily a function of applied bias voltage although the density of the work piece is also a factor.

Carbon source gas species implanted beneath the surface of the substrate, into either normal lattice positions or interstitial sites, will be strongly adhered to the substrate material. The subsurface species also provide bonding sites for subsequent source gas fragments. Thus, using this technique, a carbon based film can bond to the substrate and the implanted species increasing the adhesion between the film and the substrate.

In some embodiments, increasing the duration of the carbon seed step increases the amount of carbon present in the surface and subsurface regions of the substrate. A minimum seeding time can be required to deposit sufficient seed layer carbon to sustain a film of satisfactory hardness and thickness. The processing conditions associated with the initial bonding of carbon to the substrate material can be of infinite variation. In some embodiments, range of processing conditions is as follows: acetylene, ethylene, methane, and/or ethane gas types; gas amounts of from about 1.0 mTorr to about 10.0 mT; RF power ranging from about 50 W to about 1000 W; bias voltage of about 200V to about 2000 V; and a process time of about 5 minutes to about 20 minutes.

Preferred film properties vary depending upon application, so the conditions that provide the most favorable results will also vary.

Referring again to FIG. 1, the carbon based film is deposited as illustrated at block 112. Having established an initial bonded layer of carbon based fragments, subsequent ionized carbon source gas species that arrive at the cathode will bond to the already attached source gas fragments. It is also possible for newly arriving source gas fragments to sputter the initially bonded layer to create new open bonds to which yet other source gas fragments will bond. In this manner, a carbon based film can be deposited on a substrate material. Film deposition process parameters will vary depending upon the intended application of the film. Thus, the range of possible processing conditions is essentially infinite. However, deposition processes generally fall into one of two categories: deposition from carbon source gas alone or deposition from a mixture of carbon source gas and one or more other process gasses. In some embodiments, the processing ranges include: a gas type of acetylene, ethylene, methane, and/or ethane; gas amount ranging from about 1.0 mTorr to about 10.0 mTorr; an RF power range of about 50 W to about 1000 W; a bias voltage range of about 200 V to about 2000 V, and/or a process time of about 5 minutes to about 300 minutes.

In other embodiments, the process ranges include a gas type of acetylene, ethylene, methane, and/or ethane; other gas types that include argon, krypton, hydrogen, nitrogen, and/or fluorocarbons; a total gas amount of about 1.0 mTorr to about 20 mTorr or a gas amount for each gas ranging from 1.0 mTorr to about 50 mTorr; an RF power range of about 50 W to about 1000 W; a bias voltage range of about 200 V to about 2000 V, and/or a process time of about 5 minutes to about 300 minutes. The use of other gases besides a carbon source gas and an inert gas during deposition allows for the modification of certain film properties. These "other" gases are typically referred to as "dopant" gases. Exemplary dopant gases used during deposition include: i) Hydrogen: an excess of hydrogen introduced during deposition of the carbon film can act to cap or terminate any open bonds that exist in the growing film. By capping these open bonds, the film becomes very chemically stable/inert. This chemical stability can lower sliding resistance by reducing or eliminating the weak bonding between two sliding surfaces that causes friction. ii) Fluorine bearing gases: these gases react in a similar manner to hydrogen in regards to capping open bonds. However, the addition of fluorine to the carbon based film lowers surface energy and makes the film more hydrophobic. iii) Nitrogen: nitrogen can be added to a carbon based film to increase charge carrier density and thus increase conductivity.

Figure 3:
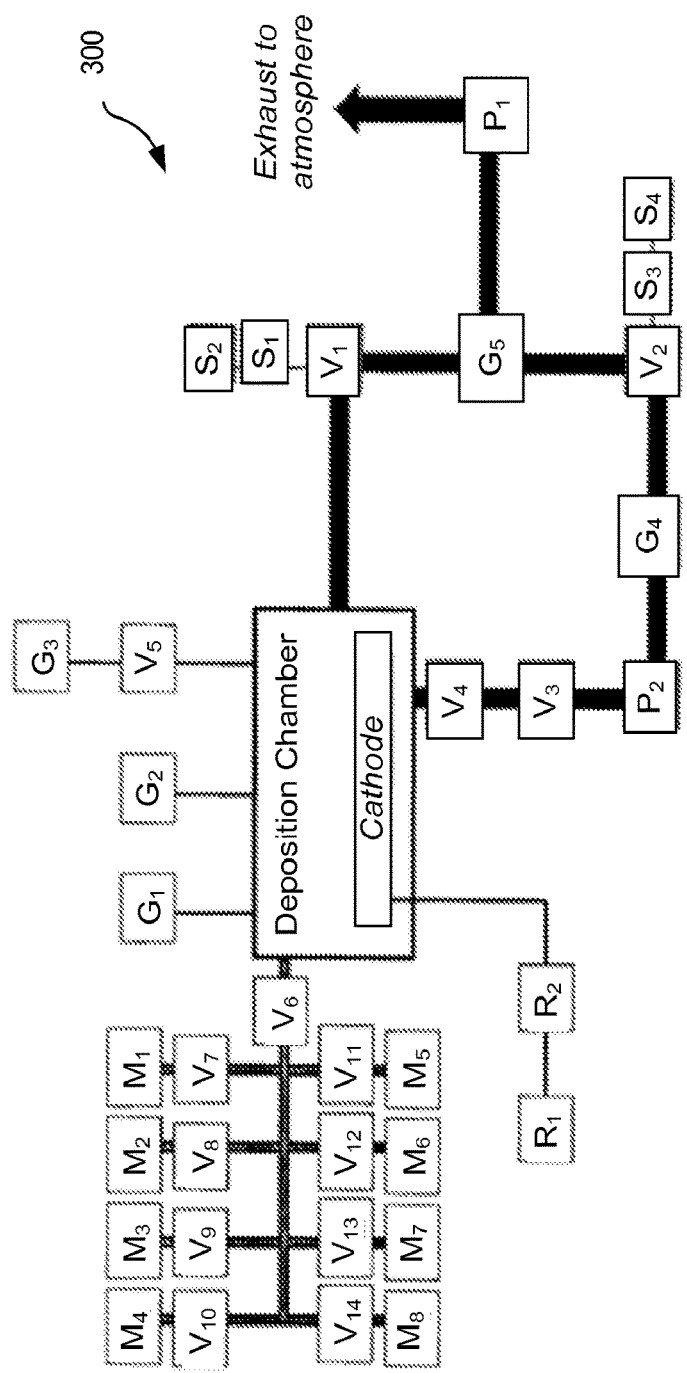
FIG. 3 illustrates a schematic diagram of a system for a PACVD process in accordance with various embodiments.

Referring again to FIG. 1, the deposition process is terminated as illustrated at block 114. After the deposition process has run for sufficient time to generate the desired film, the process is terminated. Process gas flow and RF power are terminated and the deposition chamber is returned to atmospheric pressure. FIG. 3 illustrates a schematic diagram of a system 300 that can be used to carry out the PECVD process described herein. As shown in FIG. 3, a system 300 includes a deposition chamber having a cathode positioned therein. The cathode is supplied with an RF power supply. Attached to the deposition chamber are a number of gauges and valves, and associated with the valves are various switches and mass controllers. Also illustrated in FIG. 3 are various pumps, including high vacuum and rough pumps.

Aluminum Wear Coatings for High Tolerance Interfaces

The embodiments provided herein are directed to a carbon based coating that comprise a thin film deposited on a substrate. In some embodiments, the substrate is a metal or metal alloy. For example, the carbon based coating may be deposited on aluminum surfaces that require precision tolerances and are subjected to high contact stresses under dry or starved lubrication conditions. General examples would be piston ring grooves, tool and die applications, threaded and other sliding interfaces.

Wear improvements for aluminum surfaces have traditionally been limited to anodizing and plating operations, with common types such as hard anodizing, anodizing, plating with electroless nickel and chrome plating. Exemplary plating operations include Nibore, Alcoat, Diamond Chrome, and many others (including high velocity oxy fuel (HVOF) processes). Coatings produced by such processes on aluminum applications present many issues. For example, the process is created in a chemical bath (plating) operation, which can be environmentally hazardous and can produce surfaces having dimensional inconsistencies and limited adhesion. Line of site processes such as HVOF do not produce a uniform thickness across complex geometries, cannot maintain high tolerances and/or has too high temperature conditions for good dimensional control. Further, coating produced by such inadequate processes, when in dry contact with a static partner, produce aggressive wear and material loss to mating surface.

The embodiments of the carbon based coatings presented herein are different from the aforementioned (plating/anodized/HVOF) aluminum surface coatings because they are produced with a low temperature plasma assisted chemical vapor deposition (PACVD) process, which generates a carbon based thin coating on the aluminum. The PACVD process results in a uniform coating with superior adhesion on fine features, blind cavities and complex geometry components while preserving finished dimensional tolerances. These coatings are directly bonded to the surface and do not require interfacial layers (such as chromium, nickel or silicon). In some embodiments, the carbon based coating has total thickness of less than 5 μm (microns). In other embodiments, the carbon based coating has a total thickness of about 1 μm to about 2 μm. In still other embodiments, the total thickness of the carbon based coating is from about 150 nm to about 5 μm.

The carbon based coating provides a thin layer of carbon capable of supporting increased surface loads under sliding contact with a harder material, such as steel, tungsten, titanium, nickel, and carbides. Improved surface durability characteristics (up to 500× compared to uncoated) have been demonstrated with ASTM G-99 testing under a wide range of loads and conditions, including dry, lubricated, low humidity and heated (260° F.) as illustrated in more detail below. In some embodiments, running coefficient of friction values of the carbon based coating is equal to or less than about 0.05. In other embodiments, the coefficient of friction values of the carbon based coating is less than about 0.10 under steady-state dry (un-lubricated) and atmospheric conditions.

The carbon based coatings described herein have improved surface durability for sliding contact interfaces without affecting dimensional tolerances. The method of producing the carbon based coating produces carbon on carbon layers with varying morphology and thus optical indices. The process controlled film stress allows for Coefficient of Thermal Expansion matching. Low temperature process preserves precision tolerances and fine features of coated material. High level of coating adhesion to substrate, can withstand high surface loads without de-bonding, chipping or flaking. Further, the carbon based film has low wear rates and coefficient of friction, which preserves the static partner contact surface via formation of tribofilm on the mating surface.

The carbon based coatings produced for aluminum substrates can be used to dramatically improve the wear durability and load capacity of an aluminum surface, providing a dry coefficient of friction below 0.1 while and preventing galling/gross material transfer under high contact loads. The low coefficient of friction and formation of a tribofilm on the mating surface minimizes material loss for both contact surfaces (aluminum and mating surface) under dry or starved lubrication conditions. The carbon based coating can be used in any number of applications. Carbon based coatings applied to the ring grooves of an aluminum piston provide improved durability and decreased susceptibility to micro-welding in high performance engines. Carbon based coatings applied to aluminum surfaces of rotary (wankel) type engines provide decreased friction and wear to the wiper/wall (sealing) interface, resulting in increased power and engine durability. Carbon based coatings applied to threaded interfaces results in improved lubricity and decreases the opportunity for galling and material transfer under high load conditions, and also aids in repeatable torque parameters. The carbon based coatings can be used as a replacement for wet lubricated components in harsh environments, resulting in decreased contamination. Injection mold and die materials can benefit from the tribological properties of the carbon based coating due to decrease wear on intricate contact and sliding contact surfaces and additional benefits from improved mold release. Carbon based coated aluminum surface have the opportunity to replace steel mold surfaces and thus improve thermal conductivity and decrease mold cost. Planetary gear configurations in aircraft actuators may benefit from replacing specific steel components with carbon based coated aluminum components, decreasing cost and weight while maintaining fit/function/reliability. High tolerance fretting interfaces coated with the carbon based coating, such as those that exist in kinematic mounts, demonstrate improved surface durability and lubricity under a wide range of operating conditions. Sliding and wiping interfaces, such as those that exist on the ID or OD of a cylinder can be coated with the carbon based material to provide decreased seal stiction and sliding friction. Complex fuel ports (NASCAR and other Racing) along with shocks, dampers and other suspension components (automotive, industrial, off-road, motorcycle, mountain bike) along with pitch changing tubes such as those that currently exist on the V-22 would benefit from the carbon based coating. Carbon based coatings can be applied to the wiper surfaces and cylinder walls of pneumatic or hydraulic tools/motors (dental—industrial) to improve torque, decrease internal friction and possibly replace steel/brass surfaces with lightweight aluminum while maintaining form, fit, and function. The inert nature of the carbon based coating can improve durability of aluminum engine components when subjected to sulfidized, alcohol bearing or mildly acidic fuels under high surface loads In some embodiments, the carbon based coating is wear resistant, erosion resistant, anti-reflective, and corrosion resistant. Different substrate materials, for example, may require different deposition process parameter to produce the best performance. Examples of processes and testing of various carbon based coating follow.

Examples

Sample 1 (109060101): Carbon Based Coating Deposited on Aluminum

A carbon based coating was deposited on an aluminum disc using low temperature plasma assisted chemical vapor deposition (PACVD) described hereinabove according to the following process* (see Table 1 below):

TABLE 1

|  | Step 1 | Step 2 | Step 3 |
| --- | --- | --- | --- |
| Bias Voltage | 200 | 1000 | 1000 |
| Time (min) | 30 | 2 | 10 |
| TV position[1] | 1.5 V | 1.5 V | 1.5 V |
| $TC_A$[2] (Torr) | $9.8e^{-3}$ | $1.6e^{-3}$ | $3.5e^{-3}$ |
| $Power_{DEP}$[3] | 20 W | 50 W | 500 W |
| $Gas_1$ | Argon | Acetylene | Acetylene |
| $Pressure_1$ (mTorr) | 10 | 2 | 2 |
| $Flow_1$ (sccm) | 76 | 71 | 71 |
| $Gas_2$ |  |  | Argon |
| $Pressure_2$ (mTorr) |  |  | 1 |
| $Flow_2$ (sccm) |  |  | 8 |

* throttle valve open (TVO) pressure = $8.5e^{-6}$ Torr, throttle valve closed (TVC) pressure = $2.4e^{-5}$ Torr
[1]Throttle Valve position
[2]Thermo Couple gauge reading associated with a first pressure line
[3]Power Deposition The steps of the PACVD process in the above table, and in the examples below, are described in greater detail hereinabove. The various steps occur in chronological order and give specific test parameters for each step, including, inter alia, the gas type, the gas amount, and the flow. The process gas for each step may consist of one or more gases. In some process steps, such as step 3 above, more than one gas enters the deposition chamber for that particular step.

Post Deposition Appearance and Results: the appearance of the coated aluminum disc appeared dark green and red with good adhesion of the coating to the disc.

Sample 2 (109060902): Carbon Based Coating Deposited on Steel Alloy and Aluminum Carbon based coatings were deposited on a M2 steel tappet, a non-polished aluminum coupon, and a polished aluminum coupon using low temperature plasma assisted chemical vapor deposition (PACVD) according to the following process* (see Table 2-1 below):

TABLE 2-1

|  | Step 1 | Step 2 | Step 3 | Step 4 |
| --- | --- | --- | --- | --- |
| Bias Voltage | 200 | 1000 | 1000 | 60 |
| Time (min) | 30 | 2 | 15 |  |
| TV position | 2.5 V | 2.5 V | 2.5 V | 2.5 V |
| $TC_A$ (Torr) | $1.0e^{-3}$ | $2.5e^{-3}$ | $6.5e^{-3}$ | $6.2e^{-3}$ |
| $Power_{DEP}$ (Watt) | 25 | 450 | 460 | 5 |
| $Gas_1$ | Argon | Acetylene | Acetylene | Acetylene |
| $Pressure_1$ (mTorr) | 10 | 2 | 2 | 1 |
| $Flow_1$ (sccm) | 144 | 148 | 148 | 75 |
| $Gas_2$ |  |  | Argon | Argon |
| $Pressure_2$ (mTorr) |  |  | 6 | 1 |
| $Flow_2$ (sccm) |  |  | 81 | 11 |

*TVO pressure = $5.5e^{-6}$ Torr, TVC pressure = $1.3e^{-5}$ Torr

Post Deposition Appearance and Results: the appearance of the coated M2 steel tappet substrate was dark blue, the appearance of the coated polished aluminum coupon was dark blue, and the deposited film layer on the non-polished aluminum coupon was delaminated.

The coated polished aluminum coupon (sample 2) was tested in accordance with ASTM G99-05 (Pin-on-Disk) and ASTM C1624 (linear scratch test) to measure various surface durability properties.

The Pin-on-Disk method consists of a stationary pin, or static partner, which is held in contact with a rotating disk by some fixed normal load ($F_N$). The deflection of the static partner is measured for load and this is recorded as a tangential force ($F_T$). The ration of $F_T$ to $F_N$ is calculated as the coefficient of friction (CoF). The coefficient of friction is not only materials dependent but can also be affected by changes in temperature and relative humidity. Pin-on-disk tribological measurements plot the change in CoF over time. Additional information can be extracted from this testing including wear rates.

Scratch testing involves generating a controlled scratch with an indentor of known geometry (typically spheronconical) on the sample. The tip, made of diamond or hard metal, is drawn across the surface under constant, progressive, or incremental load. At a certain critical load, the material will start to fail. The critical loads were determined by means of investigation of optical observation, acoustic emission, frictional force, and penetration depth. The critical load data were used to quantify the abrasion-resistance of a material or the adhesive properties of different film-substrate combinations. The combination of the signals constitutes a unique coating failure signature of each sample. Three to five scratches were performed per sample for statistical purposes.

ASMT G99 Test Parameters and Results:

A CSM Instruments Tribometer (S/N 18-343) was used to perform the friction wear studies.

Tribometer Parameters: Radius 6.10 mm; Linear Speed 15.00 cm/s; Normal Load 10.00 N; Stop Condition 50000 laps; Acquisition rate 1.0 Hz; Static Partner 6 mm Al2O3 sphere; Temperature 23.2° C.; and Humidity 44% RH.

Table 2-2 below provides the pin-on-disk test results.

TABLE 2-2

| |
| --- |
| Track area (um$^2$): 88.8 |
| Radius of Wear Track (mm): 6.1 |
| Coating Wear Rate (mm$^3$/N mm): 2.06E−06 |
| Average CoF: 0.188 |

Linear Scratch Test Parameters and Results:

A CSM Instruments Revetest (S/N RST 01-2617) with a 200 μm/diamond Rockwell indentor (S/N Z-280) was used to perform the scratch testing. Scratch parameters include: linear scratch type progressive: initial load 1 N; final load 80N; loading rate 80N/min; scanning load 1N; speed 2025.3 μm/min; length 2000 μm; acoustic emission sensitivity 9; and acquisition rate 30 Hz. Sample 2 deposited on the aluminum substrate was 674 μm thick.

Table 2-3 below provides the scratch test results.

TABLE 2-3

| | |
| --- | --- |
| Scratch 1 (LC1 Optic): | 17629.834 mN |
| Scratch 2 (LC1 Optic): | 19746.604 mN |
| Scratch 3 (LC1 Optic): | 19255.781 mN |
| Scratch 4 (LC1 Optic): | 20518.275 mN |
| Scratch 5 (LC1 Optic): | 19799.078 mN |
| Mean: | 19389.91 mN |
| Standard Deviation: | 1082.09 |
| % RSD | 5.58% |

Sample 3 (109061003): Carbon Based Coating Deposited on Steel Alloy and Aluminum Carbon based coatings were deposited on a M2 steel substrate and an aluminum disc using low temperature plasma assisted chemical vapor deposition according to the following process* (see Table 3 below):

TABLE 3

| | Step 1 | Step 2 | Step 3 | Step 4 |
| --- | --- | --- | --- | --- |
| Bias Voltage | 200 | 1000 | 1000 | 80 |
| Time (min) | 30 | 2 | 15 | 220 |
| TV position | 2.5 V | 2.5 V | 2.5 V | 2.5 V |
| $TC_A$ (Torr) | 9.9e$^{-3}$ | 4.4e$^{-3}$ | 7.8e$^{-3}$ | 6.1e$^{-3}$ |
| Power$_{DEP}$ (Watt) | 25 | 450 | 460 | 5 |
| Gas$_1$ | Argon | Acetylene | Acetylene | Acetylene |
| Pressure$_1$ (mTorr) | 10 | 2 | 2 | 1 |
| Flow$_1$ (sccm) | 149 | 148 | 148 | 73 |
| Gas$_2$ | | | Argon | Argon |
| Pressure$_2$ (mTorr) | | | 6 | 1 |
| Flow$_2$ (sccm) | | | 85 | 11 |

*TVO pressure = 8.6e$^{-6}$ Torr, TVC pressure = 1.7e$^{-5}$ Torr

Post Deposition Appearance and Results: the appearance of the coated M2 steel sample was dark silver had some bonding of the deposited film on the top surface, and the appearance of the aluminum disc sample was dark blue with some edge de-bonding.

Sample 4 (109062603): Carbon Based Coating Deposited on Magnesium, Steel, and Aluminum Carbon based coatings were deposited on a magnesium plate, a steel plate, and an aluminum plate using low temperature plasma assisted chemical vapor deposition according to the following process* (see Table 4 below):

TABLE 4

| | Step 1 | Step 2 | Step 3 | Step 4 |
| --- | --- | --- | --- | --- |
| Bias Voltage | 200 | 900 | 900 | 800 |
| Time (min) | 25 | 2 | 15 | 60 |
| TV position | 1.5 V | 1.5 V | 1.5 V | 1.5 V |
| $TC_A$ (Torr) | 1.2e$^{-3}$ | 6.7e$^{-3}$ | 7.5e$^{-3}$ | 6.9e$^{-3}$ |
| Power$_{DEP}$ (Watt) | 50 | 395 | 550 | 330 |
| Gas$_1$ | Argon | Acetylene | Acetylene | Acetylene |
| Pressure$_1$ (mTorr) | 10 | 2 | 2 | 3 |
| Flow$_1$ (sccm) | 56 | 89 | 59 | 89 |
| Gas$_2$ | | | Argon | Argon |
| Pressure$_2$ (mTorr) | | | 6 | 1 |
| Flow$_2$ (sccm) | | | 32 | 10 |

*TVO pressure = 4.6e$^{-6}$ Torr, TVC pressure = 2.0e$^{-5}$ Torr

Post Deposition Appearance and Results: the appearance of the coated magnesium plate sample was dark grey, the deposited film layer on the steel plate sample was delaminated, and the appearance of the coated aluminum disc sample was dark grey.

Sample 5 (110022701): Carbon Based Coating Deposited on Steel Alloy, Silicon, and Aluminum Carbon based coatings were deposited on a M2 steel substrate, a 4340 steel alloy substrate, a silicon substrate, and an aluminum substrate using low temperature plasma assisted chemical vapor deposition according to the following process* (see Table 5-1 below):

TABLE 5-1

| | Step 1 | Step 2 | Step 3 | Step 4 |
| --- | --- | --- | --- | --- |
| Bias Voltage | 600 | 750 | 750 | 600 |
| Time (min) | 30 | 5 | 15 | 150 |

TABLE 5-1-continued

|  | Step 1 | Step 2 | Step 3 | Step 4 |
|---|---|---|---|---|
| TV position | 2.5 V | 2.5 V | 2.5 V | 2.5 V |
| $TC_A$ (Torr) | $4.4e^{-3}$ | $4.2e^{-3}$ | $4.3e^{-3}$ | $1.8e^{-2}$ |
| $Power_{DEP}$ (Watt) | 200 | 325 | 325 | 200 |
| $Gas_1$ | Argon | Acetylene | Argon | Acetylene |
| $Pressure_1$ (mTorr) | 10 | 4 | 10 | 4 |
| $Flow_1$ (sccm) | 40.4 | 40.9 | 40.4 | 40.9 |
| $Gas_2$ |  |  |  | $H_2$ |
| $Pressure_2$ (mTorr) |  |  |  | 9 |
| $Flow_2$ (sccm) |  |  |  | 135.50 →118.7 |

*TVO pressure = $1.0e^{-5}$ Torr, TVC pressure = $3.2e^{-5}$ Torr

Post Deposition Appearance and Results: the appearance of the coated M2 steel, 4340 steel alloy, silicon, and the aluminum substrate were each dark grey.

Sample 5 was coated on an aluminum substrate and a steel alloy substrate and was tested in accordance with ASTM C1624 (linear scratch test), which is described hereinabove, to measure surface durability properties. Further, another carbon based coating was deposited on a steel tappet and also tested according to ASTM C1624.

Linear Scratch Test Parameters and Results:

A CSM Instruments Revetest Scratch Tester (S/N 01-2617) with a 200 μm Rockwell indentor (S/N B-217) and with a 100 μm/diamond Rockwell indentor (S/N I-110) were used to perform the scratch testing. Scratch parameters were linear scratch type progressive: initial load 0.9 N; final load 30N; loading rate 30N/min; scanning load 0.9N; speed 3090 μm/min; length 3000 μm; acoustic emission sensitivity 9; acquisition rate 30 Hz; temperature 24.1° C., and humidity 23.00% RH.

Table 5-2 below provides the scratch test results.

TABLE 5-2

|  |  | Sample 5/Al | Sample 5/Steel | Tappet |
|---|---|---|---|---|
| LC1 Optic | Data: 1 | 1.555 | 4.017 | 3.993 |
| [N] | Data: 2 | 1.984 | 3.582 | 4.231 |
|  | Mean | 1.770 | 3.799 | 4.112 |
|  | Std Dev | 0.304 | 0.307 | 0.168 |
| LC2 Optic | Data: 1 | 9.512 | 16.151 | 17.204 |
| [N] | Data: 2 | 9.341 | 16.766 | 17.185 |
|  | Mean | 9.426 | 16.458 | 17.194 |
|  | Std Dev | 0.121 | 0.435 | 0.013 |

Samples 6a-d: Carbon Based Film Deposition on Aluminum Alloy, Steel Alloys, and Silicon Carbon based coatings were deposited on 6061 aluminum (alloy that includes at least Al, Mg, and Si), M2 steel (tungsten-molybdenum high speed steel), 9310 steel (nickel-chromium-molybdenum steel), and silicon substrates using low temperature plasma assisted chemical vapor deposition according to the following process* (see Table 6-1 below).

TABLE 6-1

|  | Step 1 | Step 2 | Step 3 | Step 4 |
|---|---|---|---|---|
| Sample 6a |  |  |  |  |
| Bias Voltage | 600 | 800 | 800 | 600 |
| Time (min) | 30 | 5 | 25 | 45 |
| $Gas_1$ | Argon | Acetylene | Argon | Acetylene |
| $Pressure_1$ (mTorr) | 10 | 4 | 10 | 1 |
| $Gas_2$ |  |  |  | Argon |
| $Pressure_2$ (mTorr) |  |  |  | 5 |
| Sample 6b |  |  |  |  |

TABLE 6-1-continued

|  | Step 1 | Step 2 | Step 3 | Step 4 |
|---|---|---|---|---|
| Bias Voltage | 600 | 800 | 800 | 600 |
| Time (min) | 30 | 5 | 25 | 45 |
| $Gas_1$ | Argon | Acetylene | Argon | Acetylene |
| $Pressure_1$ (mTorr) | 10 | 4 | 10 | 1 |
| $Gas_2$ |  |  |  | Argon |
| $Pressure_2$ (mTorr) |  |  |  | 10 |
| Sample 6c |  |  |  |  |
| Bias Voltage | 600 | 800 | 800 | 600 |
| Time (min) | 30 | 5 | 25 | 90 |
| $Gas_1$ | Argon | Acetylene | Argon | Ethylene |
| $Pressure_1$ (mTorr) | 10 | 4 | 10 | 1 |
| $Gas_2$ |  |  |  | Argon |
| $Pressure_2$ (mTorr) |  |  |  | 5 |
| Sample 6d |  |  |  |  |
| Bias Voltage | 600 | 800 | 800 | 600 |
| Time (min) | 30 | 5 | 25 | 90 |
| $Gas_1$ | Argon | Acetylene | Argon | Ethylene |
| $Pressure_1$ (mTorr) | 10 | 4 | 10 | 1 |
| $Gas_2$ |  |  |  | Argon |
| $Pressure_2$ (mTorr) |  |  |  | 10 |

The samples were tested as indicated in the tables below in accordance with ASTM G99-05 (Pin-on-Disk method). Tables 6-2 and 6-3 contain test parameters and data for the samples tested at a 5N load under un-lubricated conditions, and tables 6-4 and 6-5 contain test parameters and data for the samples tested at a 10N load under un-lubricated conditions.

TABLE 6-2

|  | Sample 6a | Sample 6b |
|---|---|---|
| Coating Thickness (nm) | 986 | 1063 |
| Substrate | Aluminum 6061 | Aluminum 6061 |
| Stop Condition | 500 m | 150 m |
| Radium (nm) | 10.00 | 9.99 |
| Linear speed (cm/sec) | 45 | 45 |
| Load (N) | 5 | 5 |
| Static partner (SP) | $Al_2O_3$ 6 mm Sphere | $Al_2O_3$ 6 mm Sphere |
| Atmosphere | Nitrogen | Nitrogen |
| Temperature (° C.) | 24.2 | 24.2 |
| Humidity (%) | 14 | 16 |
| Lubrication | none | none |
| Start (CoF) | 0.160 | 0.131 |
| Min (CoF) | 0.062 | 0.052 |
| Max (CoF) | 0.602 | 0.639 |
| Mean (CoF) | 0.099 | 0.091 |
| Standard Deviation | 0.055 | 0.068 |
| Total distance (m) | 161 | 141 |
| Track Area (μm$^2$) |  | 357 |
| Coating WR[1] (mm$^3$/N mm) |  | 3.17E-05 |
| SP Cap Diameter (μm) | 389.74 | 430.13 |
| SP WR[1] (mm$^3$/N mm) | 4.69E-07 | 7.94E-07 |

[1]wear rate

TABLE 6-3

|  | Sample 6c | Sample 6d |
|---|---|---|
| Coating Thickness (nm) | 865 | 1383 |
| Substrate | Aluminum 6061 | Aluminum 6061 |
| Stop Condition | 125 m | 125 m |
| Radium (nm) | 10.00 | 9.99 |
| Linear speed (cm/sec) | 45 | 45 |
| Load (N) | 5 | 5 |
| Static partner (SP) | $Al_2O_3$ 6 mm Sphere | $Al_2O_3$ 6 mm Sphere |
| Atmosphere | Nitrogen | Nitrogen |
| Temperature (° C.) | 24.2 | 24.2 |
| Humidity (%) | 16 | 16 |
| Lubrication | none | none |

TABLE 6-3-continued

| | Sample 6c | Sample 6d |
|---|---|---|
| Start (CoF) | 0.131 | 0.069 |
| Min (CoF) | 0.051 | 0.041 |
| Max (CoF) | 0.171 | 0.162 |
| Mean (CoF) | 0.087 | 0.072 |
| Standard Deviation | 0.031 | 0.029 |
| Total distance (m) | 97 | 125 |
| Track Area ($\mu m^2$) | 232 | 169 |
| Coating WR[1] ($mm^3$/N mm) | 3.00E−05 | 1.69E−05 |
| SP Cap Diameter ($\mu m$) | 382.55 | 356.6 |
| SP WR[1] ($mm^3$/N mm) | 7.23E−07 | 4.24E−07 |

[1]wear rate

As shown in Tables 6-2 and 6-3 above, Sample 6d was measured as having the lowest mean coefficient of friction at 0.072. Further, the wear resistance of Sample 6d was measured to be greater than Samples 6B and 6C.

TABLE 6-4

| | Sample 6a | Sample 6b |
|---|---|---|
| Coating Thickness (nm) | 986 | 1063 |
| Substrate | Aluminum 6061 | Aluminum 6061 |
| Stop Condition | CoF ≥.55 | CoF ≥.55 |
| Radium (nm) | 8.01 | 8.01 |
| Linear speed (cm/sec) | 45 | 45 |
| Load (N) | 10 | 10 |
| Static partner (SP) | $Al_2O_3$ 6 mm Sphere | $Al_2O_3$ 6 mm Sphere |
| Atmosphere | Nitrogen | Nitrogen |
| Temperature (° C.) | 24.2 | 24.2 |
| Humidity (%) | 16 | 16 |
| Lubrication | none | none |
| Start (CoF) | 0.178 | 0.164 |
| Min (CoF) | 0.098 | 0.119 |
| Max (CoF) | 0.574 | 0.671 |
| Mean (CoF) | 0.130 | 0.169 |
| Standard Deviation | 0.038 | 0.131 |
| Total distance (m) | 12.230 | 11.580 |
| Track Area ($\mu m^2$) | 1037 | 3239 |
| Coating WR[1] ($mm^3$/N mm) | 4.27E−04 | 1.41E−03 |
| SP Cap Diameter ($\mu m$) | 625.83 | 538 |
| SP WR[1] ($mm^3$/N mm) | 2.06E−05 | 1.19E−05 |

[1]wear rate

TABLE 6-5

| | Sample 6c | Sample 6d |
|---|---|---|
| Coating Thickness (nm) | 865 | 1383 |
| Substrate | Aluminum 6061 | Aluminum 6061 |
| Stop Condition | CoF ≥.55 | CoF ≥.55 |
| Radium (nm) | 8.01 | 8.01 |
| Linear speed (cm/sec) | 45 | 45 |
| Load (N) | 10 | 10 |
| Static partner (SP) | $Al_2O_3$ 6 mm Sphere | $Al_2O_3$ 6 mm Sphere |
| Atmosphere | Nitrogen | Nitrogen |
| Temperature (° C.) | 24.2 | 24.2 |
| Humidity (%) | 16 | 16 |
| Lubrication | none | none |
| Start (CoF) | 0.144 | 0.165 |
| Min (CoF) | 0.095 | 0.115 |
| Max (CoF) | 0.661 | 0.682 |
| Mean (CoF) | 0.130 | 0.143 |
| Standard Deviation | 0.097 | 0.096 |
| Total distance (m) | 14.700 | 15.600 |
| Track Area ($\mu m^2$) | 2132 | 1965 |
| Coating WR[1] ($mm^3$/N mm) | 7.28E−04 | 6.32E−04 |
| SP Cap Diameter ($\mu m$) | 487.73 | 421.15 |
| SP WR[1] ($mm^3$/N mm) | 6.29E−06 | 3.29E−06 |

[1]wear rate

As shown in Tables 6-4 and 6-5 above, Sample 6b was measured as having the highest mean coefficient of friction and the weakest wear resistance.

Samples 7A-7B: Carbon Based Coating Deposited on Aluminum:

Carbon based coatings were deposited on a glass substrate, a silicon substrate, and an aluminum disc using low temperature plasma assisted chemical vapor deposition according to the following process* (see Table 7 below):

TABLE 7

| Sample 7a | | | | |
|---|---|---|---|---|
| | Step 1 | Step 2 | Step 3 | Step 4 |
| Bias Voltage | 200 | 1000 | 300 | 80 |
| Time (min) | 30 | 10 | 3 | 180 |
| $TC_A$ (Torr) | $3.7e^{-3}$ | $2.7e^{-3}$ | $1e^{-3}$ | $4.3e^{-3}$ |
| Input Power scalar | 0.365 | 0.102 | 0.479 | 0.061 |
| $Gas_1$ | Argon | Argon | Acetylene | Acetylene |
| $Pressure_1$ (mTorr) | 5 | 5 | 1 | 1 |
| $Flow_1$ (sccm) | 54 | 54 | 56 | 56 |
| $Gas_2$ | | | | Argon |
| $Pressure_2$ (mTorr) | | | | 5 |
| $Flow_2$ (sccm) | | | | 54 |

*TVO pressure = $5.5e^{-6}$ Torr, TVC pressure = $9.8e^{-6}$ Torr

| Sample 7b | | | | |
|---|---|---|---|---|
| | Step 1 | Step 2 | Step 3 | Step 4 |
| Bias Voltage | 200 | 1000 | 300 | 60 |
| Time (min) | 30 | 10 | 3 | 180 |
| $TC_A^2$ (Torr) | $3.5e^{-3}$ | $3.7e^{-3}$ | $1.1e^{-3}$ | $5.9e^{-3}$ |
| Input Power scalar | 0.355 | 0.113 | 0.477 | 0.038 |
| $Gas_1$ | Argon | Argon | Acetylene | Acetylene |
| $Pressure_1$ (mTorr) | 10 | 10 | 2 | 2 |
| $Flow_1$ (sccm) | 107 | 107 | 109 | 109 |
| $Gas_2$ | | | | Argon |
| $Pressure_2$ (mTorr) | | | | 10 |
| $Flow_2$ (sccm) | | | | 107 |

*TVO pressure = $5.7e^{-6}$ Torr, TVC pressure = $9.2e^{-6}$ Torr

Post Deposition Appearance and Results: Sample 7A appeared dark on the glass substrate, green on the silicon substrate, and red and green on the aluminum disc. Sample 7B appeared dark on the glass substrate, red and green on the silicon substrate, and the coating on the aluminum disc debonded.

Sample 8a-8d: Carbon Based Coating Deposited on Aluminum

Carbon based coatings were deposited on 60 mm diameter, polished aluminum 6061 disks using low temperature plasma assisted chemical vapor deposition according to the following process* (see Table 8-1 below). Samples 8a and 8b were based on a high bias voltage, single process gas, high pressure, variable time (i.e., thickness) process. Samples 8c and 8d were based on an intermediate bias voltage, dual process gases, high total pressure, variable time (i.e., thickness) process.

TABLE 8-1

| Sample 8a (110111803) | | |
|---|---|---|
| | Step 1 | Step 2 |
| Bias Voltage | 800 | 1175 |
| Time (min) | 5 | 35 |
| TV position[1] | 31.7% | 31.7% |
| $TC_A$ (Torr) | | $1.0e^{-2}$ |
| $Power_{DEP}$ (Watt) | 625 | 880 |
| $Gas_1$ | Argon | Acetylene |

TABLE 8-1-continued

| Pressure$_1$ (mTorr) | 5 | 10 |
|---|---|---|
| Flow$_1$ (sccm) | 28.5 | 194 |

*TVO pressure = 2.5e$^{-5}$ Torr, TVC pressure = 6.0e$^{-5}$ Torr
1% by which the throttle valve is open Sample 8b (110111804)

|  | Step 1 | Step 2 |
|---|---|---|
| Bias Voltage | 800 | 1175 |
| Time (min) | 5 | 70 |
| TV position1 | 31.7% | 31.7% |
| TC$_A$ (Torr) |  | 9.8E-3 |
| Power$_{DEP}$ (Watt) | 455 | 900 |
| Gas$_1$ | Argon | Acetylene |
| Pressure$_1$ (mTorr) | 5 | 10 |
| Flow$_1$ (sccm) | 28.0 | 194 |

*TVO pressure = 3.4e$^{-5}$ Torr, TVC pressure = 1.0e$^{-4}$ Torr
1% by which the throttle valve is open Sample 8c (110111902)

|  | Step 1 | Step 2 | Step 3 | Step 4 |
|---|---|---|---|---|
| Bias Voltage | 600 | 770 | 770 | 600 |
| Time (min) | 30 | 5 | 15 | 150 |
| TV position$^1$ | 29.1% | 29.1% | 29.1% | 29.1% |
| TC$_A$ (Torr) |  |  | 3.0e$^{-4}$ | 1.2e$^{-2}$ |
| Power$_{DEP}$ (Watt) | 330 | 450 | 475 | 385 |
| Gas$_1$ | Argon | Acetylene | Argon | Acetylene |
| Pressure$_1$ (mTorr) | 10 | 4 | 10 | 4 |
| Flow$_1$ (sccm) | 44 | 44 | 44 | 44 |
| Gas$_2$ |  |  |  | H$_2$ |
| Pressure$_2$ (mTorr) |  |  |  | 9 |
| Flow$_2$ (sccm) |  |  |  | 143.5 |

*TVO pressure = 2.4e$^{-5}$ Torr, TVC pressure = 8.5e$^{-5}$ Torr
1% by which the throttle valve is open Sample 8d (110112201)

|  | Step 1 | Step 2 | Step 3 | Step 4 |
|---|---|---|---|---|
| Bias Voltage | 600 | 770 | 770 | 600 |
| Time (min) | 30 | 5 | 15 | 225 |
| TV position$^1$ | 29.1% | 29.1% | 29.1% | 29.1% |
| TC$_A$ (Torr) | 5.0e$^{-4}$ |  |  | 1.0e$^{-2}$ |
| Power$_{DEP}$ (Watt) | 360 | 480 | 530 | 305 |
| Gas$_1$ | Argon | Acetylene | Argon | Acetylene |
| Pressure$_1$ (mTorr) | 10 | 4 | 10 | 4 |
| Flow$_1$ (sccm) | 46 | 40.5 | 46 | 40.5 |
| Gas$_2$ |  |  |  | H$_2$ |
| Pressure$_2$ (mTorr) |  |  |  | 9 |
| Flow$_2$ (sccm) |  |  |  | 136 |

*TVO pressure = 2.4e$^{-5}$ Torr, TVC pressure = 8.5e$^{-5}$ Torr
1% by which the throttle valve is open Post Deposition Appearance and Results: the appearance of all coated samples was black.

Figure 20:
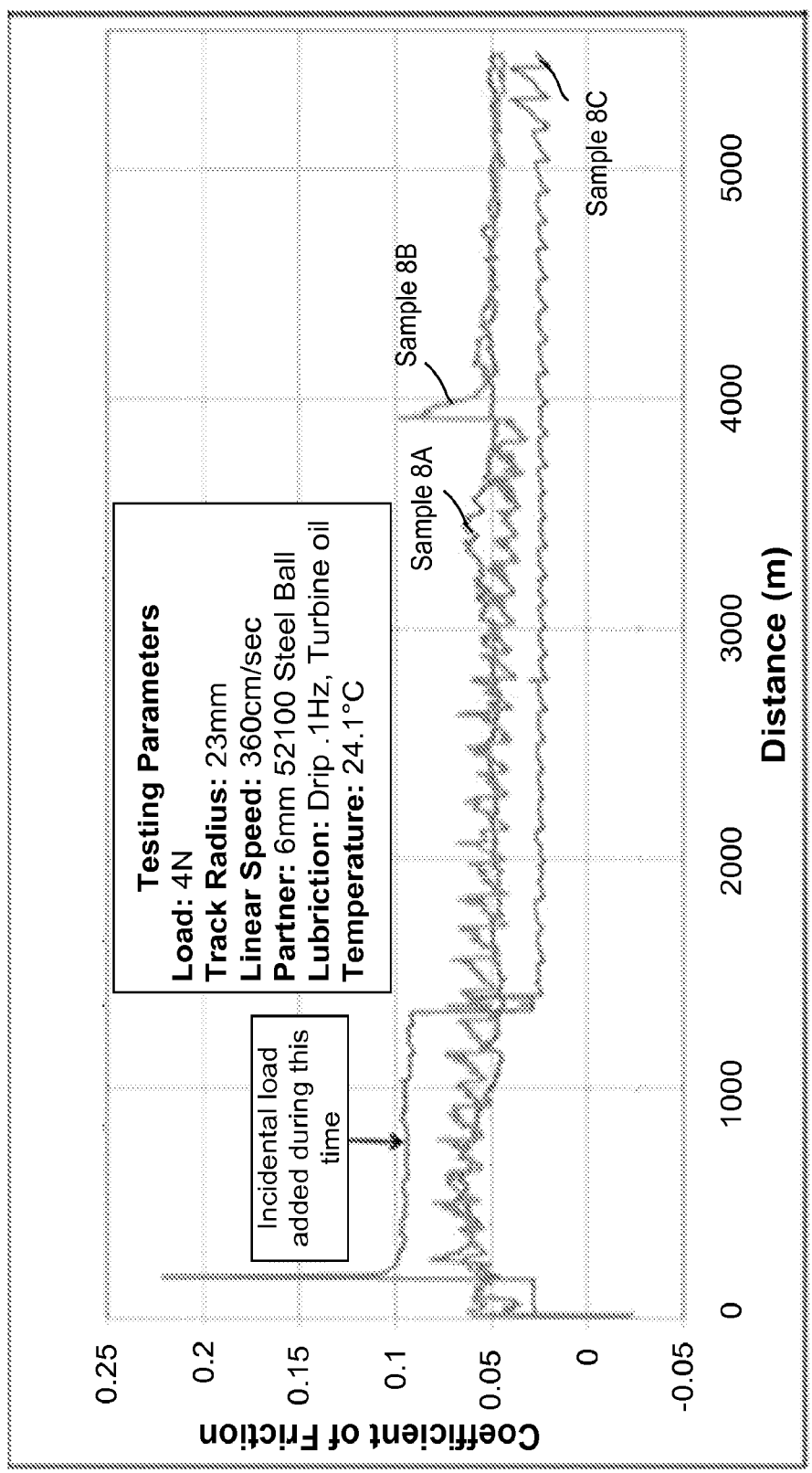
FIG. 20 illustrates a line graph of test data associated with a carbon based coating in accordance with various embodiments.
Figure 21:
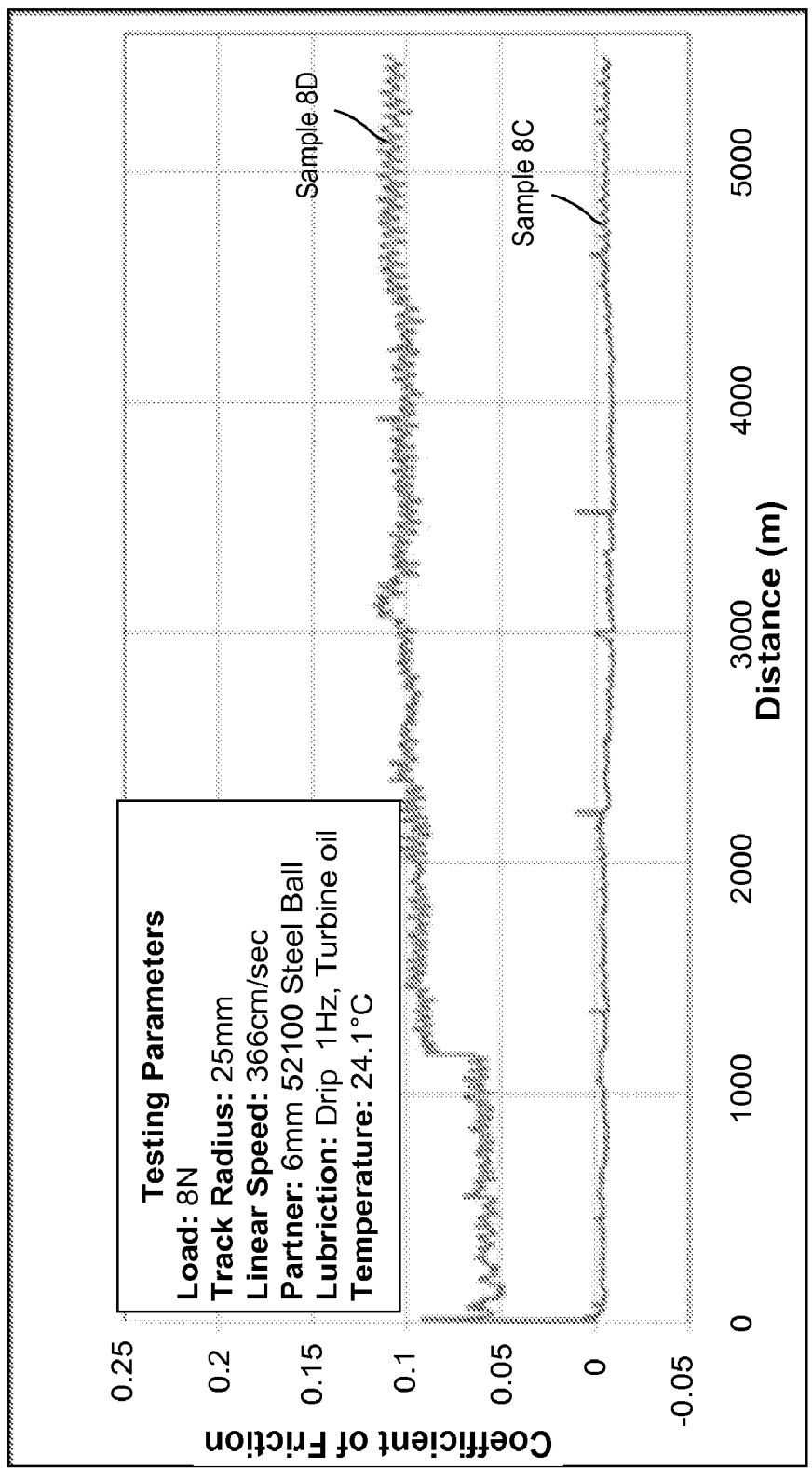
FIG. 21 illustrates a line graph of test data associated with a carbon based coating in accordance with various embodiments.

Samples 8a-8d, coated on the aluminum disks, were tested for wear in accordance with ASTM G99-05 (pin-on disk) described hereinabove. The pin-on-disk test parameters include: disk material aluminum 6061, pin material 52100 steel, 60 mm disk diameter, 6 mm pin diameter, lubricated test environment (drip 0.1 Hz SHELL Turbine 560), normal loads of 4N and 8N, linear speeds of 360 cm/s (for 4N load test) and 366 cm/s (for 8N load test), a 23 mm radius 52100 steel ball (for 4N load test), a 25 mm radium 52100 steel ball (for 8N load test) and a 5,500 m duration. FIG. 20 illustrates a graph of the 4N load test and FIG. 21 illustrates a graph of the 8N load test. The graphs plot coefficient of friction (y-axis) and distance (x-axis). As shown in FIGS. 20 and 21, sample 8c had the best measurement at both 4N and 8N loads and all samples had coefficient of frictions at or below around 0.1. In general, samples 8c and 8d, prepared using an intermediate bias voltage, dual process gases, high total pressure process performed better than samples 8a and 8b, which were prepared by a high bias voltage, single process gas, high pressure process.

Carbon based material was simultaneously deposited on multiple aluminum rings using the intermediate bias voltage, dual process gases, high total pressure process to produce uniform, dark coated rings. A bare aluminum ring, a ring coated with the carbon based material, an aluminum ring coated with "Coating Y," and an aluminum ring coated with "Coating Z" were tested for temperature, friction, wear scar width (block), mass loss (block), and mass loss (ring) in accordance with ASTM G77 (block-on-ring test). The block-on-ring test parameters include aluminum 6061 ring material, cast iron block material, 35 mm ring diameter, 6.35 mm block contact width, lubricated test environment, normal loads of 44N, 60N, 65N, and 70N, cycles per minute of 2000, and a duration of 5, 5, 10, and 5 minutes. Table 8-2 below provides a summary of the test results.

TABLE 8-2

|  | Mass Loss Block(g) | Mass Loss Ring(g) | Avg Scar (mm) | CoF |
|---|---|---|---|---|
| Lubricant: Mobil Pegasus 1 | | | | |
| Uncoated | 0.0001 | 0.0929 | 0.592 | 0.044 |
| Uncoated | 0 | 0.1012 | 0.614 | 0.059 |
| Uncoated | −0.0002 | 0.1034 | 0.711 | 0.06 |
| CB Coated | 0.0008 | 0.0004 | 1.669 | 0.082 |
| CB Coated | 0.0007 | 0.0001 | 1.601 | 0.075 |
| CB Coated | 0.0007 | 0.0001 | 1.57 | 0.082 |
| Coating Y | 0.8804 | 0.0011 | 14.605 | 0.044 |
| Coating Y | 0.8001 | −0.0007 | 14.546 | 0.023 |
| Coating Y | 0.9992 | 0.0007 | 15.875 | 0.023 |
| Coating Z | 0.193 | −0.0044 | 9.575 | −0.024 |
| Coating Z | 0.1346 | −0.0088 | 8.513 | 0.007 |
| Coating Z | 0.1405 | 0.0076 | 8.623 | 0.002 |
| Lubricant: Castrol Aviator AD65 | | | | |
| Uncoated | 0.0002 | 0.0026 | 0.728 | 0.024 |
| Uncoated | 0 | 0.0638 | 0.52 | 0.058 |
| Uncoated | 0 | 0.0817 | 0.728 | 0.059 |
| CB Coated | 0.0006 | 0.0003 | 0.1572 | 0.076 |
| CB Coated | 0.0008 | 0.000 | 1.559 | 0.077 |
| CB Coated | 0.0005 | 0.000 | 1.518 | 0.082 |
| Coating Y | 0.9816 | 0.0004 | 15.875 | 0.023 |
| Coating Y | 0.9795 | −0.002 | 15.875 | 0.021 |
| Coating Y | 0.9943 | 0.0012 | 15.875 | −0.038 |
| Coating Z | 0.1154 | −0.0072 | 8.119 | 0.008 |
| Coating Z | 0.1506 | −0.0076 | 8.869 | −0.007 |
| Coating Z | 0.0681 | −0.0113 | 6.864 | 0.019 |
| Lubricant: Aeroshell Turbine Oil 560 | | | | |
| Uncoated | 0.0002 | 0.1832 | 0.667 | 0.05 |
| Uncoated | 0 | 0.2174 | 0.713 | 0.054 |
| Uncoated | 0.0001 | 0.3128 | 0.781 | 0.079 |
| CB Coated | 0.0012 | 0.0000 | 1.836 | 0.061 |
| CB Coated | 0.0015 | 0.0004 | 1.886 | 0.061 |
| CB Coated | 0.0014 | 0.0003 | 1.855 | 0.065 |
| Coating Y | 0.9443 | 0.0025 | 15.875 | −0.009 |
| Coating Y | 0.9512 | −0.002 | 15.875 | −0.035 |
| Coating Y | 0.947 | 0.0001 | 15.875 | −0.016 |
| Coating Z | 0.0414 | −0.0102 | 5.794 | 0.035 |
| Coating Z | 0.0415 | −0.0104 | 5.814 | 0.045 |
| Coating Z | 0.0482 | −0.0087 | 6.096 | 0.045 |

CB Coating samples (carbon based coating samples) produced very low wear rates under all loading condition and lubricants. CB Coating samples were between 70 to 700 times better from a material loss (wear) perspective than the Uncoated, Coating Y, and Coating Z samples. Further, the CB Coating samples had minimal material loss on both block and ring. The Bare samples exhibited high ring mass loss and small block scar since the bare ring was softer than the block. Coating Y and Coating Z exhibited high block wear and large block scar.

Further testing was done using carbon based material deposited on 70XX aluminum disks using the intermediate bias voltage, dual process gases, high total pressure process described hereinabove. Ball on disk testing was performed, where the test parameters included a load of 5N, a static partner material of 52100 steel ball (6 mm), speed of 10 cm/s, a 12 mm track radius, the test being performed in an un-lubricated environment, under ambient condition environment, and 35% humidity. In tribometry, a sphere, a pin, or flat is loaded on the test sample with precisely know force. The friction coefficient is determined during the test by measuring the deflection of the elastic arm. Wear coefficients for the pin and disk materials are calculated from the volume of material lost during the test. This simple method facilitates the study of friction and wear. Further, the control of the test parameters such as speed frequency, contact, pressure, time, and environmental parameters (temperature, humidity, and lubricant) allows simulation of the real life conditions of a practical wear situation.

Figure 22:
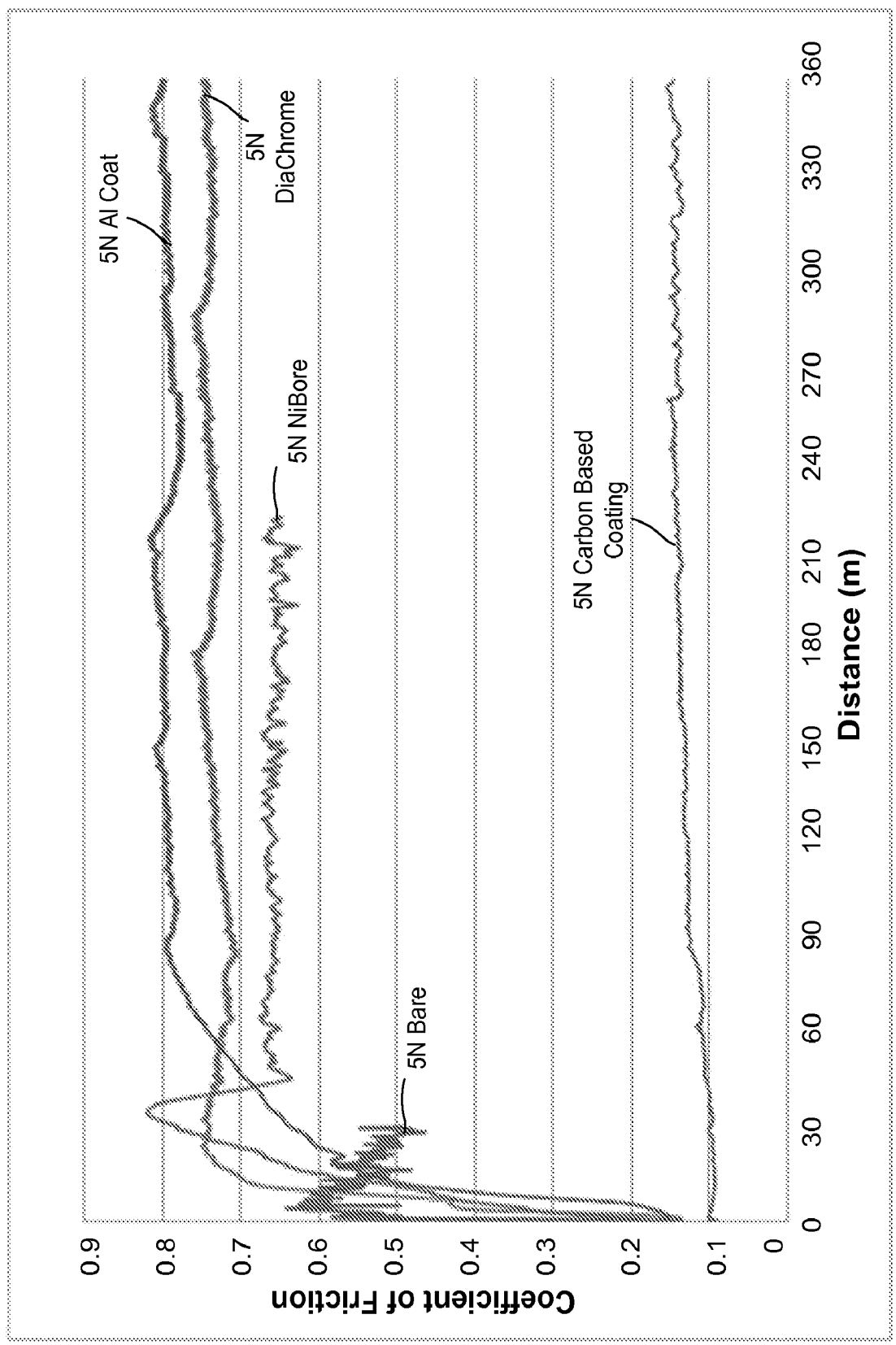
FIG. 22 illustrates a line graph of test data associated with a carbon based coating in accordance with various embodiments.
Figure 23:
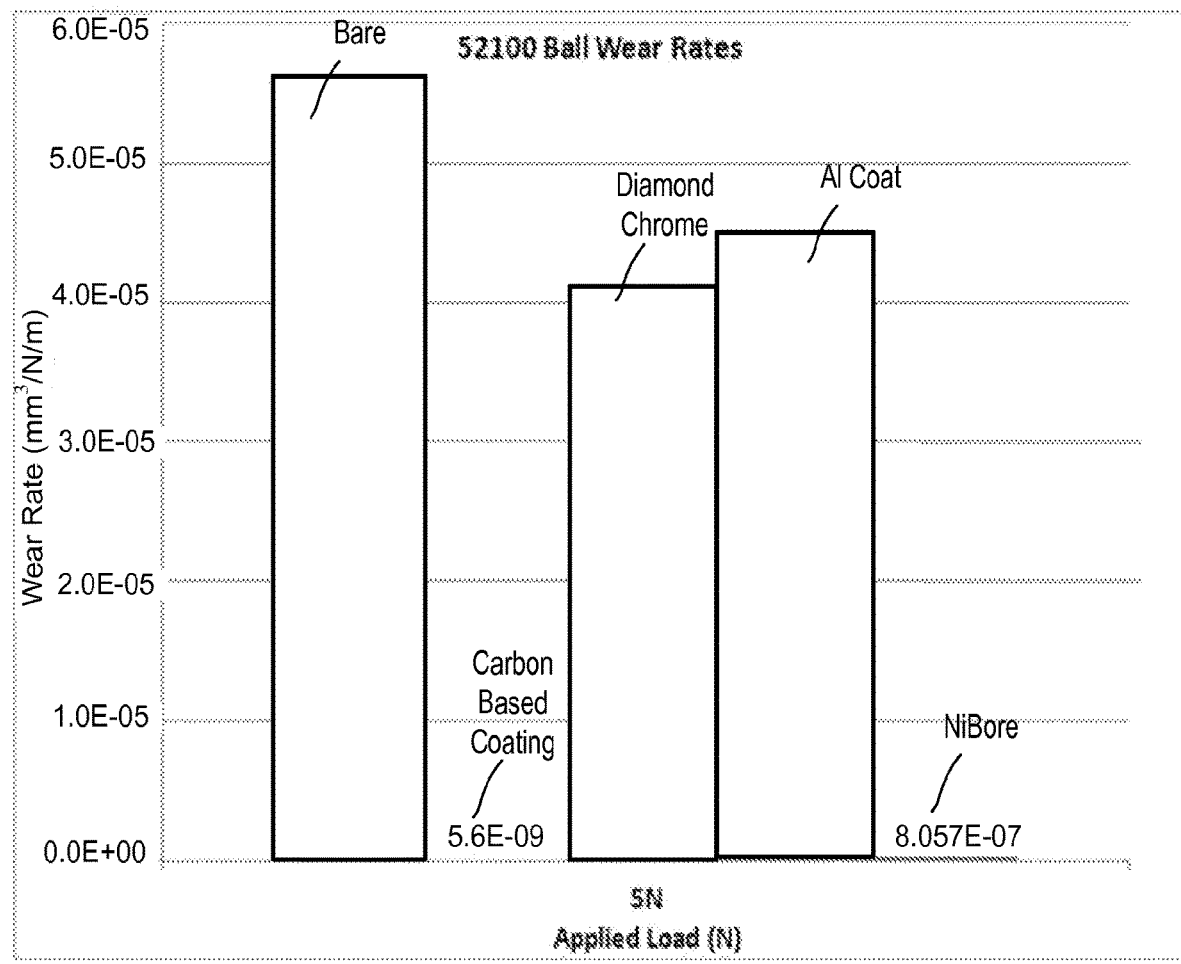
FIG. 23 illustrates a bar graph of test data associated with a carbon based coating in accordance with various embodiments.

FIG. 22 illustrates a graph of the carbon based coating sample and samples of commercial chromium and nickel coatings, as well as an aluminum coating, and a bare disk sample at 5N loads. The graph in FIG. 22, using the test data from the ball on disk test to plot the coefficient of friction data and distance, characterizes the durability of the samples. Testing of the nibore sample was discontinued due to coating failure and disk wear track formation. Testing of the bare sample was discontinued at 30 minutes due to excessive galling of the uncoated disk. As clearly shown in FIG. 22, carbon based coating sample exhibited the lowest coefficient of friction numbers. FIG. 23 illustrates a bar graph of the wear rate plotted against the applied load of 5N. Here again, it is clearly shown that the carbon based coating sample exhibited the best wear resistance at 5.6E-09 mm$^3$/N/mm.

Figure 24:
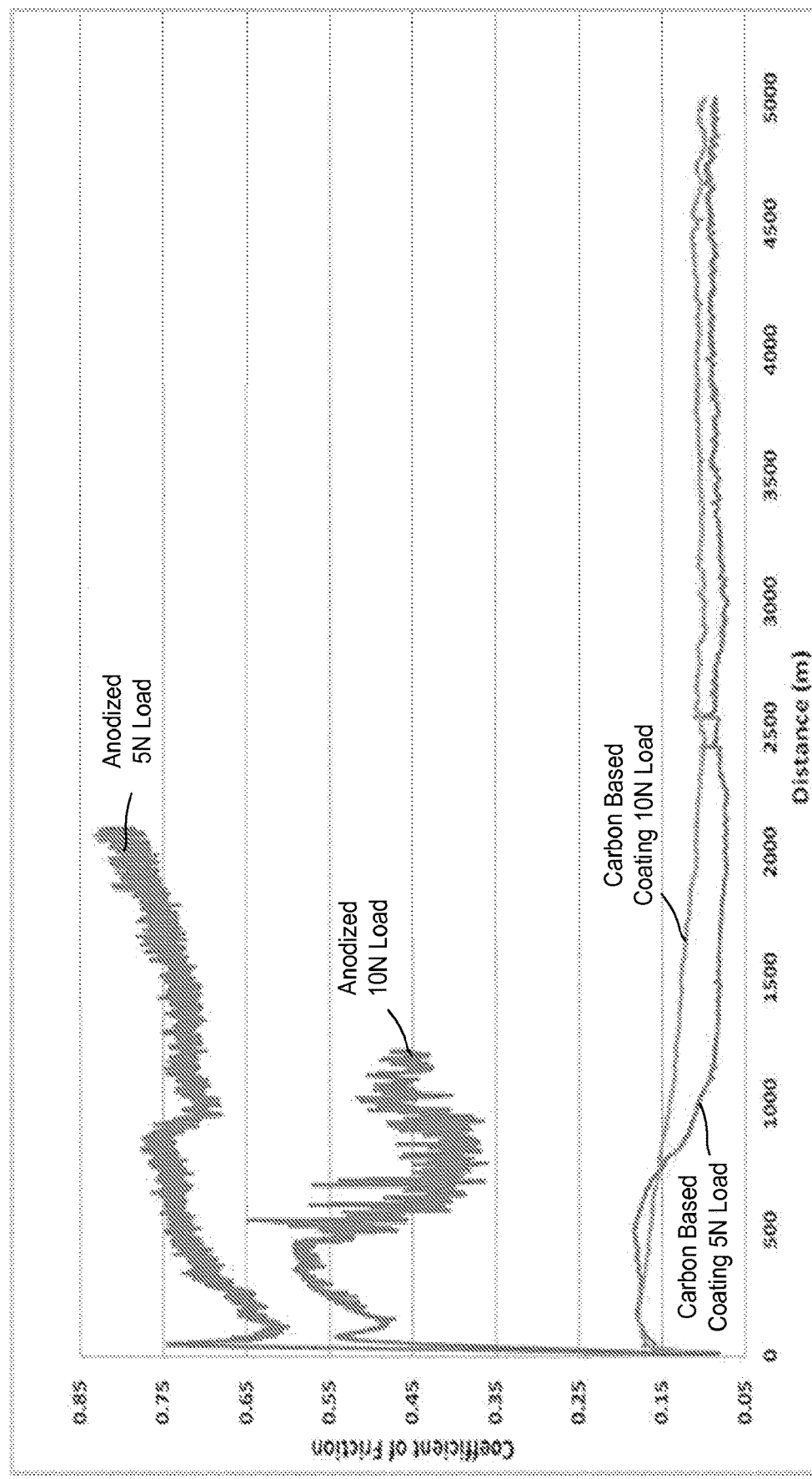
FIG. 24 illustrates a line graph of test data associated with a carbon based coating in accordance with various embodiments.

Still further ball-on-disk testing was performed using carbon based material deposited on 6061 aluminum disks using the intermediate bias voltage, dual process gases, high total pressure process described hereinabove. The carbon based coating samples were tested against an anodized 6061 aluminum disk. Two ball-on-disk tests were performed, one test with a 5N load and the other test with a 10N load. The test parameters included a carbon based coating thickness of about 1.8 µm, an anodized thickness of about 20 µm, a 52100 steel ball (6 mm) static partner, a 150 cm/s sliding velocity, a 6061 aluminum substrate material, and an un-lubricated environment. FIG. 24 illustrates a graph plotting the data points of the coefficient of friction and distance measured using the ball-on-disk test of all of the samples for both the 5N load test and the 10N load test. The graph in FIG. 24 clearly indicates that the carbon based coating samples have a much lower coefficient of friction than the anodized samples at both load values.

Tribological Coatings for Non-Magnetic Biomedical Materials

In some embodiments, the carbon based coating is applied to biomedical materials. Exemplary biomedical materials include metals, metal alloys, non-magnetic materials such as stainless steel (e.g., custom 465, 17-4 PH, 13-8 PH, and CoCr alloys), titanium grade metals, (e.g., 6A1-4V and others), non-implant applications, temporary implants, external fixation trauma hardware (screws, pins, plates, clamps), precision sliding interfaces such as hip implant ball/sockets, knee, spine sliding surfaces, implant grade nails, pins, screws and plates to improve biocompatibility and also improve performance of mechanical junctions, such as threaded interfaces, and/or the like.

Non-magnetic materials such as stainless steel (examples are Custom 465, 17-4 PH, 13-8 PH, CoCr Alloys) and titanium grades (example 6A1-4V and others) are used for trauma hardware, external fixation and implants because they are MRI safe and provide some level of bio-compatibility. These materials, when used in mechanical interfaces such as clamps, screws and threads, tend to have poor tribological performance which leads to limited repositioning, uneven torque parameters, and in worst cases stuck or stripped mechanical junctions. Additionally, for implant grade sliding interfaces such as metal on metal joint replacements, these materials can begin to wear and produce debris when in contact and eventually lead to removal/subsequent replacement. Failure of these interfaces is often due to formation of contaminates or bio-deposits that form on the interface, which in turn causes a surface asperity. Once the mating surface is damaged, wear, degraded performance and irritation follow.

The carbon based coatings provided herein have excellent adhesion and tribological performance on non-magnetic materials in addition to good biocompatibility from a "surface cloaking" perspective as illustrated in the examples provided below. For external fixation applications, the use of the carbon based coating on threaded and clamped interfaces will allow non-magnetic materials to repeat perform under high torque loads without the risk of thread galling or stripping. (see testing of examples below) This is especially important for small diameter/fine thread applications where high contact loads exist. The interface durability of aluminum alloys are also improved with the carbon based coatings to the point where they may serve as a replacement for titanium and stainless steel in certain external fixation applications, drastically decreasing the materials and machining costs while maintaining fit/function of devices. For implant applications, carbon based coated surfaces of metal on metal (MoM) joints may be drastically improved. These devices rely on precision ground, match-fit surfaces to maintain smooth and consistent joint performance. Application of traditional coatings is limited due to the high processing temperature (which can dimensionally distort parts) or use of interfacial layers (potentially toxic, excessive thickness/dimensional loss). The exceptional tribological performance of the carbon based coatings coupled with a high level of adhesion and low processing temperature make these coatings an excellent candidate for improving durability and performance of MoM joints. Other implant devices such as pins, nails, plates and screws are also good candidates for the carbon based coating due to the biocompatibility of the coating.

Surface bonding is achieved through a novel process of cyclic surface seeding-argon bombardment. This process reduces intrinsic process related film stress, provides a mechanism for physical bonding, and increases the chemical bonding with the underlying substrate material (see process examples below).

In some embodiments, the coating is produced with the low temperature Plasma Assisted Chemical Vapor Deposition (PACVD) process, which generates a carbon based thin coating on the non-magnetic materials. The PACVD process results in a uniform coating with superior adhesion on fine features, blind cavities, and complex geometry components while preserving finished dimensional tolerances. These coatings are directly bonded to the surface and do not require interfacial layers (such as chromium, nickel or silicon). In some embodiments, the carbon based coating has total thickness of less than 5 μm (microns). In other embodiments, the carbon based coating has a total thickness of about 1 μm to about 2 μm. In still other embodiments, the total thickness of the carbon based coating is from about 150 nm to about 5 μm.

The coating provides a thin layer of carbon capable of supporting increased surface loads under sliding contact with a harder material, such as steel, tungsten, titanium, nickel, and carbides. Improved surface durability characteristics (up to 500× compared to uncoated) have been demonstrated with ASTM G-99 testing under a wide range of loads and conditions, including dry, lubricated, low humidity and heated (260° F.). In some embodiments, running coefficient of friction values of the carbon based coating is equal to or less than about 0.05. In other embodiments, the coefficient of friction values of the carbon based coating is less than about 0.10 under steady-state dry (un-lubricated) and atmospheric conditions.

Biomedical materials coated with the carbon based coating using the PACVD process provide a number of characteristics, including encapsulation of surface structure with the carbon based coating; controlled amorphous carbon content; low temperature process preserves precision tolerances and fine features of coated material; high level of coating adhesion to substrate, which can withstand high surface loads without de-bonding, chipping or flaking; durable interface capable of withstanding blood immersion; and the coating is "bacteria neutral," i.e., does not inhibit bacteria, but also does not promote bacteria growth Examples Carbon Based Coating—Stryker Hip Components A uniform hard carbon/tetrahedral amorphous carbon coating was applied to mating surfaces of ball and socket hip components to provide improved surface hardness, a decreased coefficient of friction, and improved corrosion resistance. In the example coating, the ball surface had a very thin (~200 nm) coating that appeared light blue, while the socket had approximately 300 nm of the carbon based coating.

Sample a (111111801): Carbon Based Film Deposition on Steel

Carbon based coatings were deposited on two 465 stainless steel one inch pucks using low temperature plasma assisted chemical vapor deposition according to the following process* (see Table 9-1 below):

TABLE 9-1

| | Step 1 | Step 2 |
|---|---|---|
| Bias Voltage | 800 | 1000 |
| Time (min) | 15 | 30 |
| TV position[1] | 27.5% | 27.5% |
| $TC_A$ (Torr) | $1.2e^{-3}$ | $2.2e^{-3}$ |
| $Power_{DEP}$ (Watt) | 570 | 730 |
| $Gas_1$ | Argon | Acetylene |
| $Pressure_1$ (mTorr) | 4 | 4 |
| $Flow_1$ (sccm) | 16.5 | 42.8 |

*TVO pressure = $7.3e^{-6}$ Torr, TVC pressure = $2.3e^{-5}$ Torr
1% by which the throttle valve is open Post Deposition Appearance and Results: the appearance of the coated steel substrate was black with no defects.
Sample B (111111802): Carbon Based Film Deposition on Steel Carbon based coatings were deposited on two 465 stainless steel one inch pucks using low temperature plasma assisted chemical vapor deposition according to the following process* (see Table 10-1 below):

TABLE 10-1

| | Step 1 | Step 2 | Step 3 | Step 4 | Step 5 |
|---|---|---|---|---|---|
| Bias Voltage | 800 | 800 | 800 | 800 | 800 |
| Time (min) | 15 | 5 | 5 | 15 | 90 |
| TV position[1] | 27.5% | 27.5% | 27.5% | 27.5% | 27.5% |
| $TC_A$ (Torr) | $4.3e^{-3}$ | $8.0e^{-3}$ | $3.2e^{-3}$ | $4.4e^{-3}$ | $1.6e^{-2}$ |
| $Power_{DEP}$ (Watt) | 600 | 517 | 467 | 534 | 500 |
| $Gas_1$ | Argon | Argon | Acetylene | Argon | Acetylene |
| $Pressure_1$ (mTorr) | 10 | 10 | 4 | 10 | 4 |
| $Flow_1$ (sccm) | 44.5 | 44.5 | 43.7 | 44.5 | 43.7 |
| $Gas_2$ | | Acetylene | | | $H_2$ |
| $Pressure_2$ (mTorr) | | 4 | | | 9 |
| $Flow_2$ (sccm) | | 43.7 | | | 143.0 |

Figure 8:
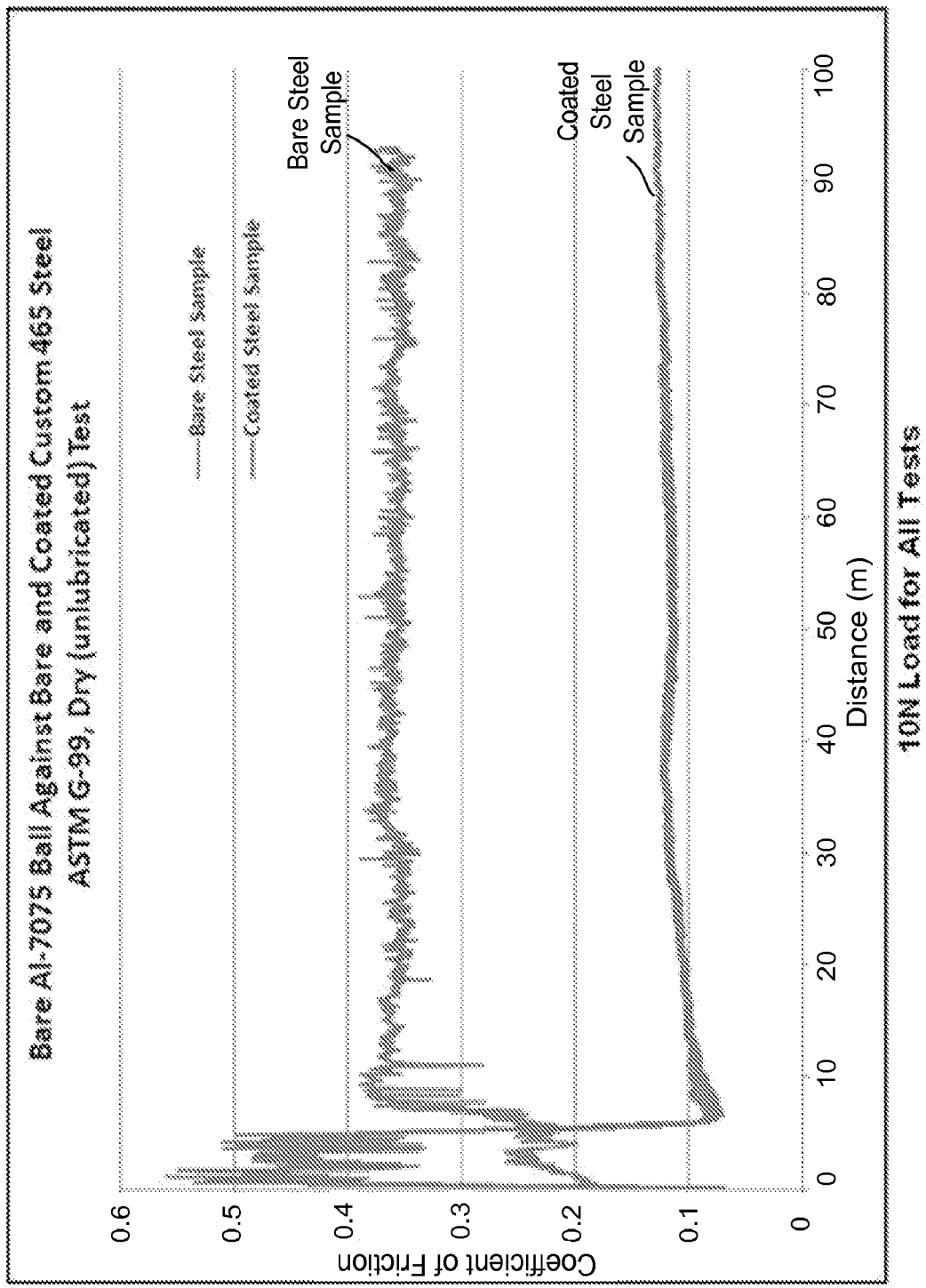
FIG. 8 illustrates a line graph of test data associated with a carbon based coating in accordance with various embodiments.

*TVO pressure = $7.5e^{-6}$ Torr, TVC pressure = $2.7e^{-5}$ Torr
1% by which the throttle valve is open Post Deposition Appearance and Results: the appearance of the coated steel substrate was black.
Carbon Based Coating Testing A carbon based material (e.g., the sample 9 or the sample 10) deposited onto 465 steel was tested to measure wear, running friction, and durability using the ball-and-disk method described hereinabove. A bare 465 steel disk was also tested according to the ball-and-disk method as a control. The test parameters include a load of 10N, static partner materials of 52100 steel and 7075 aluminum balls (both 6 mm), a 10 cm/s speed, a track radius variable by test, and ambient environment at about 35% humidity, and un-lubricated environment. As shown in FIG. 8, the coefficient of frictions of the coated steel sample was measured to be under 0.2 during the test conditions, while the bare steel control sample exhibited a much higher coefficient of friction of over 0.3.

Figure 9:
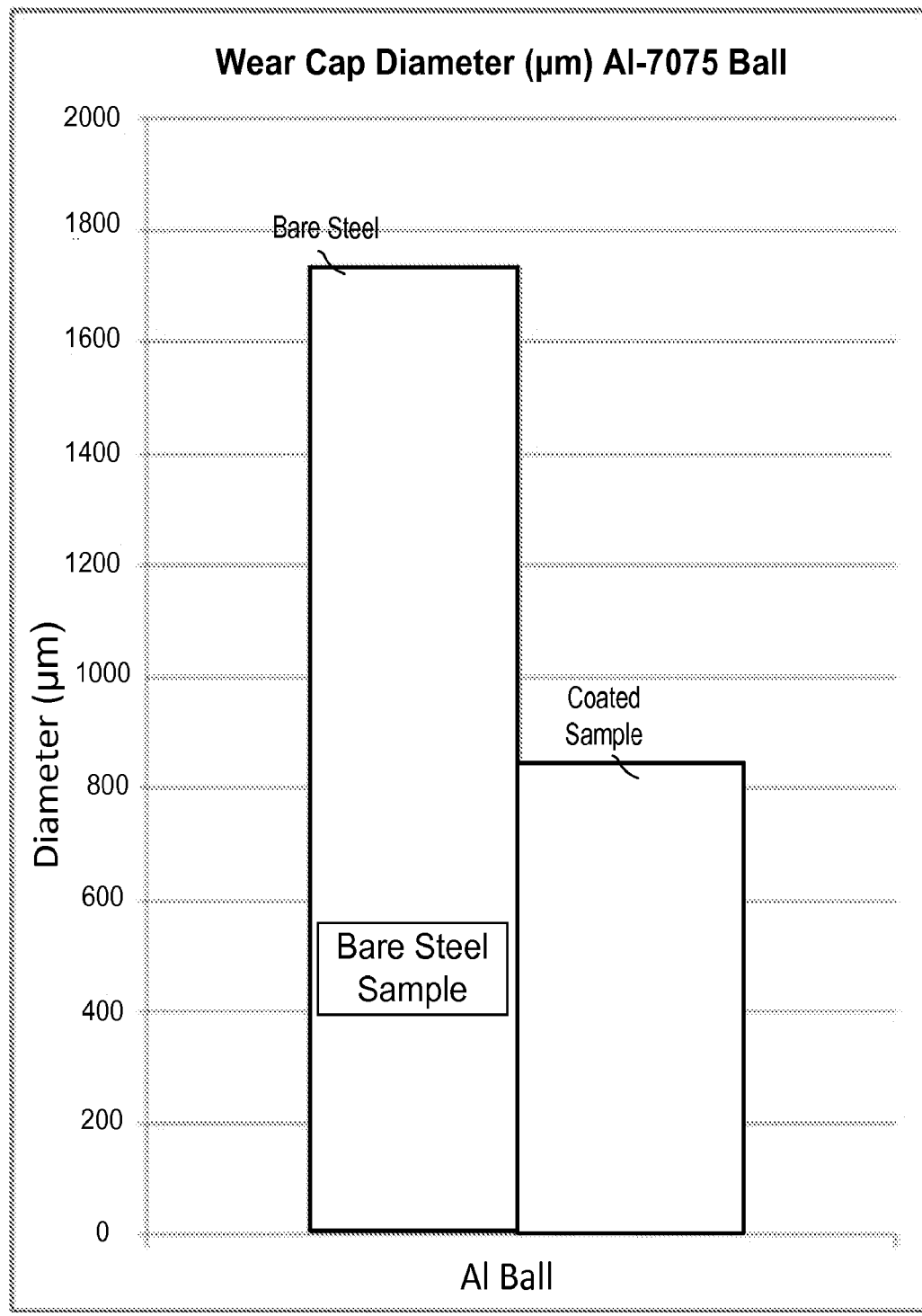
FIG. 9 illustrates a bar graph of test data associated with a carbon based coating in accordance with various embodiments.
Figure 10:
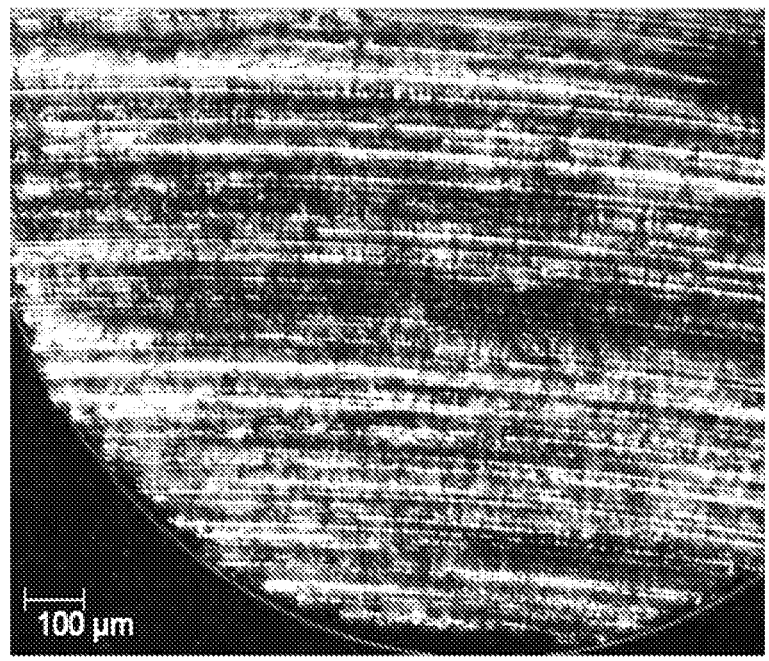
FIG. 10 illustrates a SEM image of a surface in accordance with various embodiments.
Figure 11:
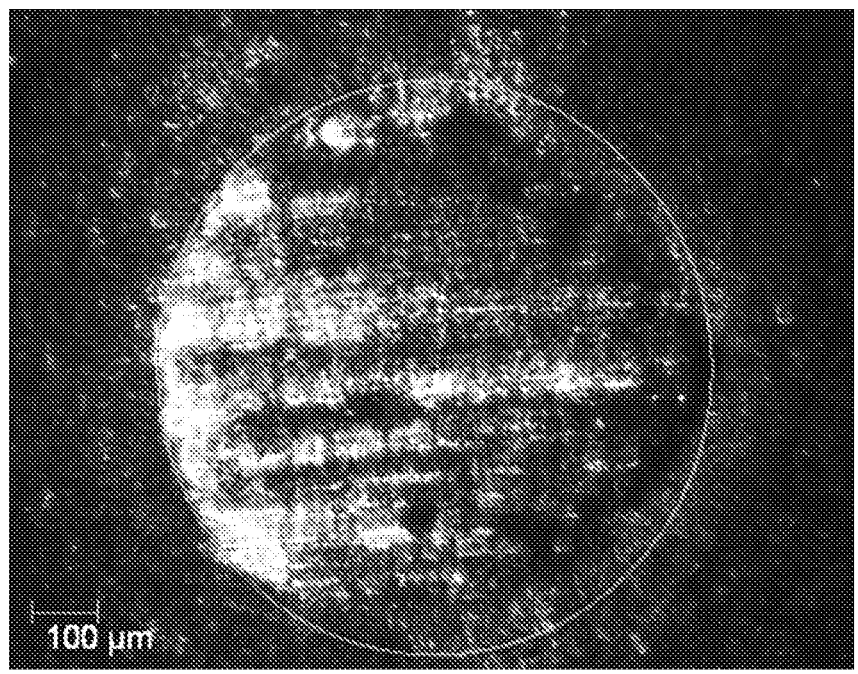
FIG. 11 illustrates a SEM image of a surface in accordance with various embodiments.
Figure 12:
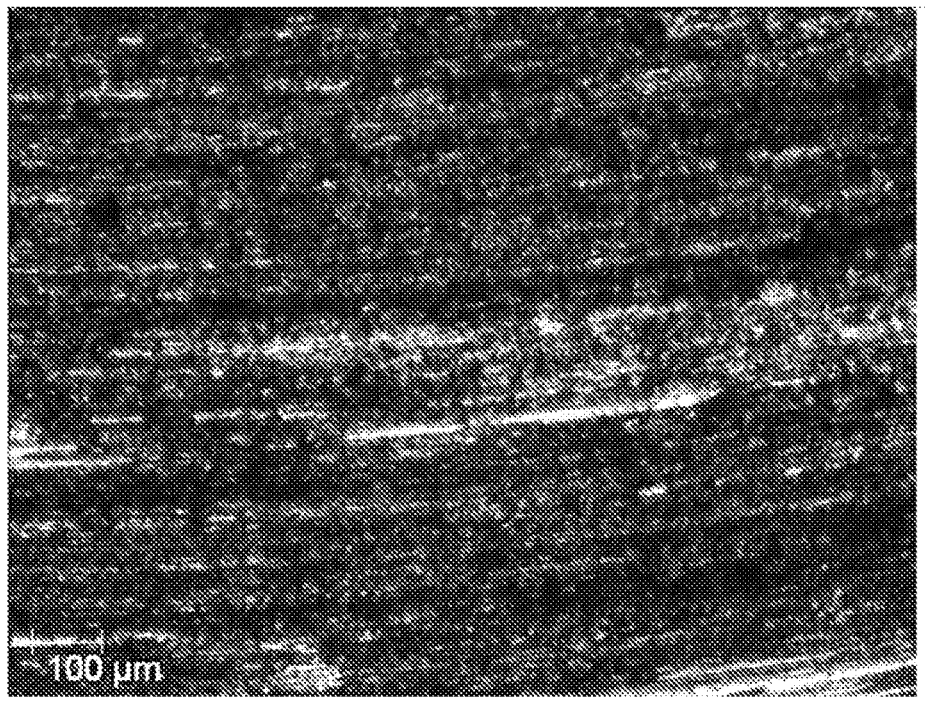
FIG. 12 illustrates a SEM image of a surface in accordance with various embodiments.
Figure 13:
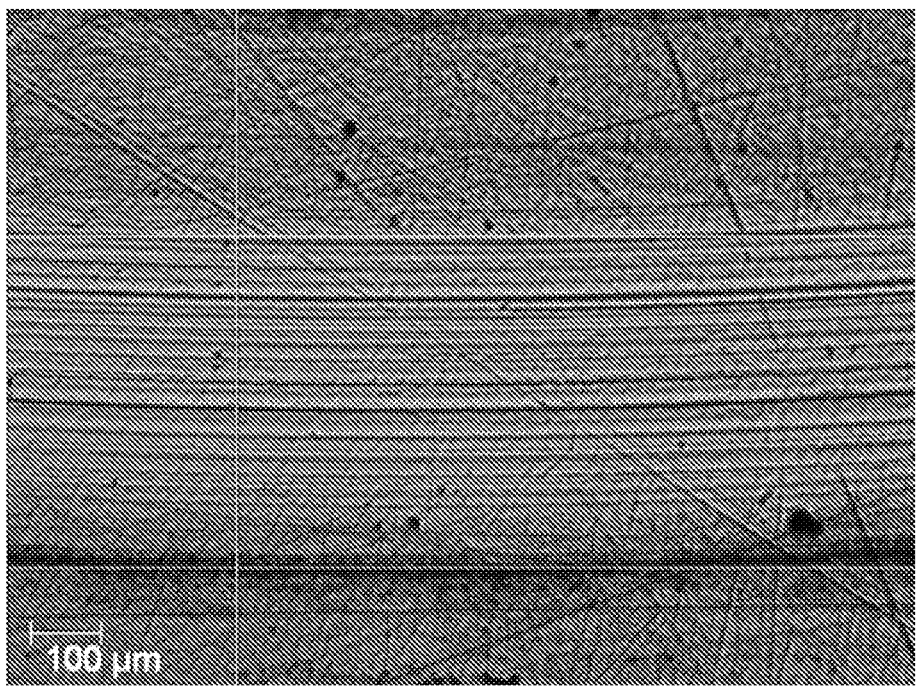
FIG. 13 illustrates a SEM image of a surface in accordance with various embodiments.

FIG. 9 illustrates a bar graph comparing the bare steel sample and the coated steel sample, where the coated steel sample exhibits a much stronger wear resistance than the bare steel sample as indicated by the wear cap diameter. FIG. 10 shows an SEM image of the static partner (7075 aluminum ball) detailing the scratches formed on the surface of the static partner by the bare 465 steel disk. FIG. 11, shows an SEM image of the 7075 aluminum static partner with much less wear when the coated 465 steel disk was used. FIG. 12 shows an SEM image of the wear track formed on the bare 465 disk surface, where the wear track exceeds the field of view due to the excessive 7075 aluminum static partner wear. FIG. 13 shows an SEM image of the wear track formed on the coated 465 disk surface. A comparison of the images of FIGS. 12 and 13 shows that the coated sample has much less wear than the bare 465 disk.

Figure 14:
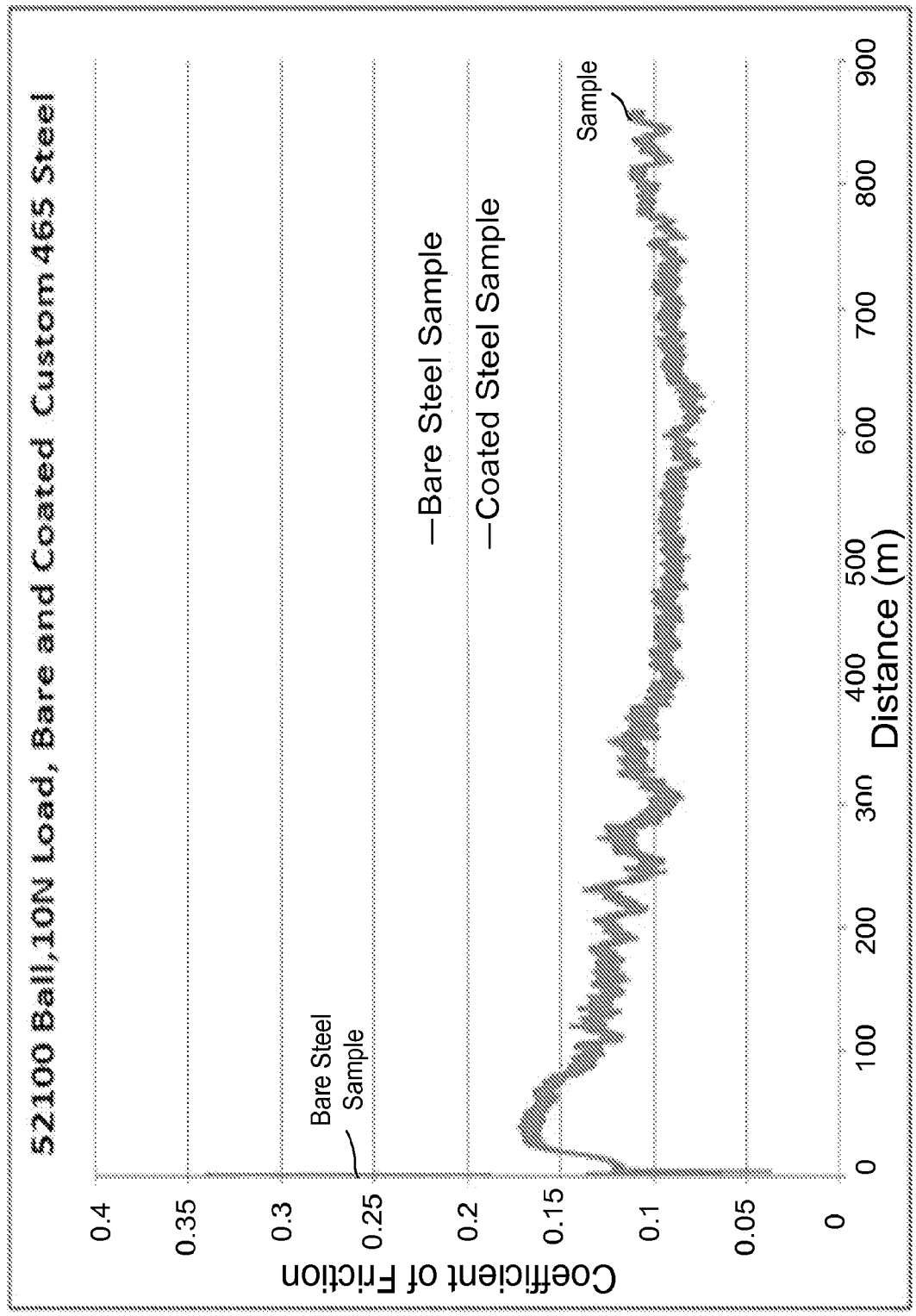
FIG. 14 illustrates a line graph of test data associated with a carbon based coating in accordance with various embodiments.
Figure 15:
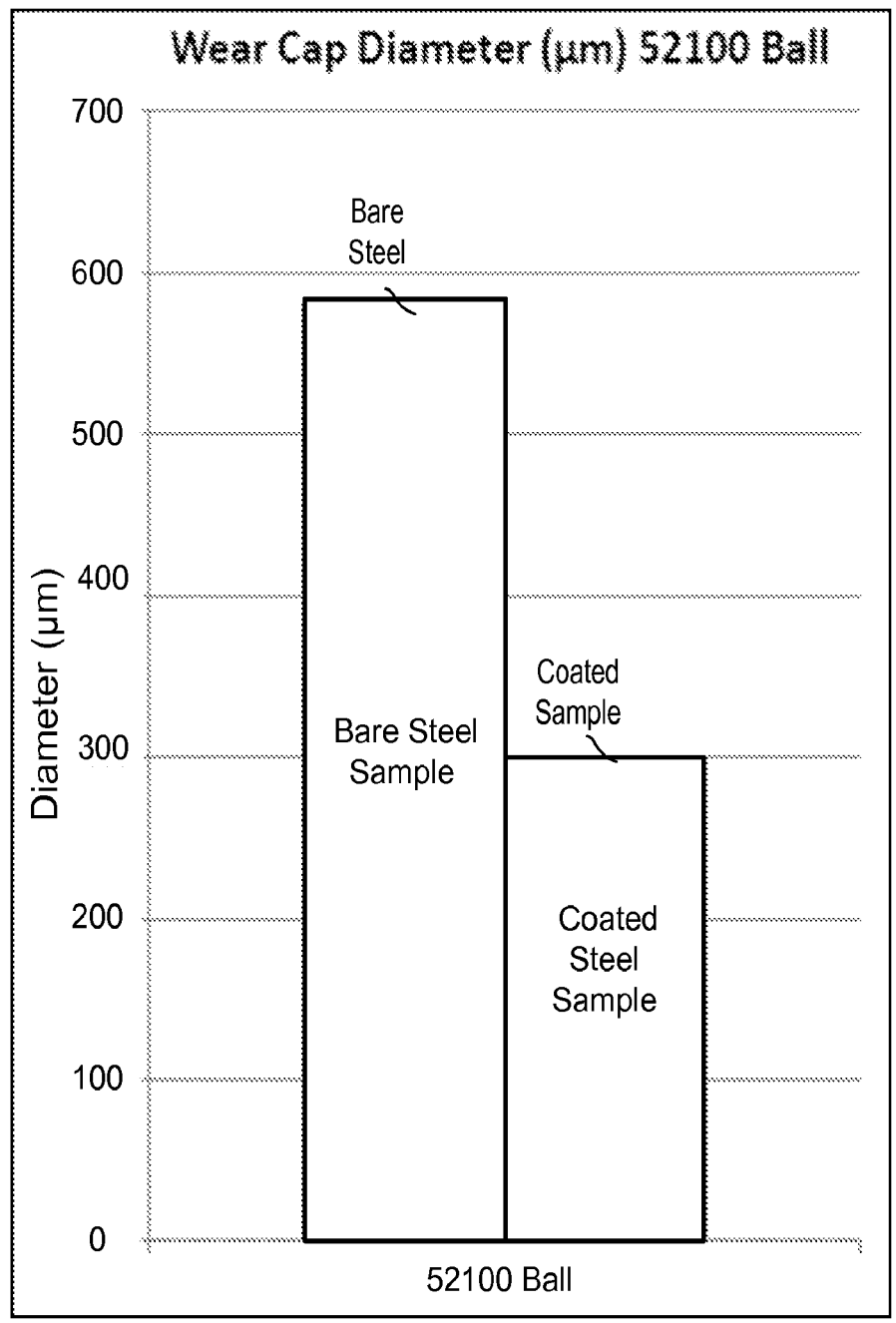
FIG. 15 illustrates a bar graph of test data associated with a carbon based coating in accordance with various embodiments.
Figure 16:
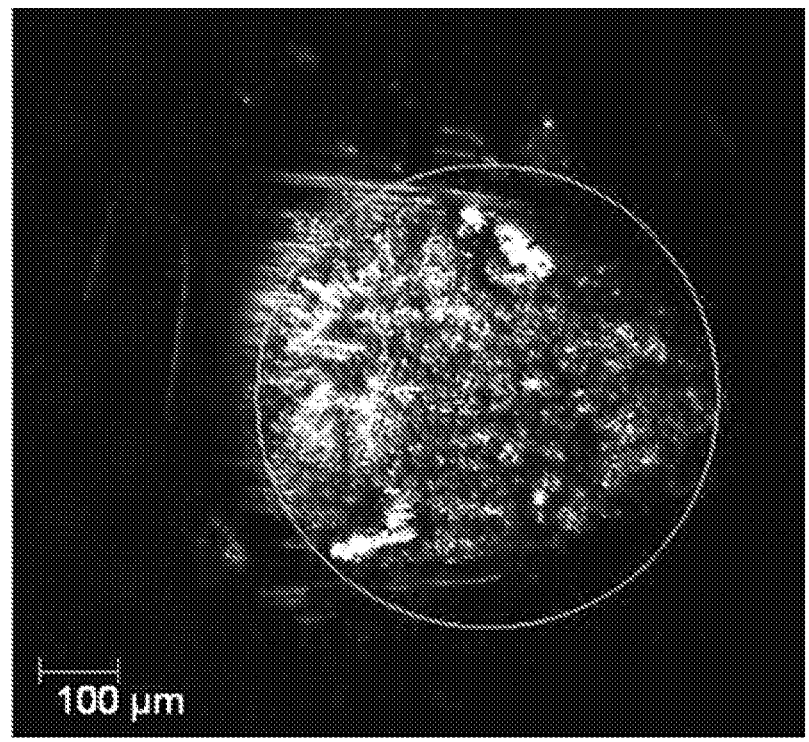
FIG. 16 illustrates a SEM image of a surface in accordance with various embodiments.
Figure 17:
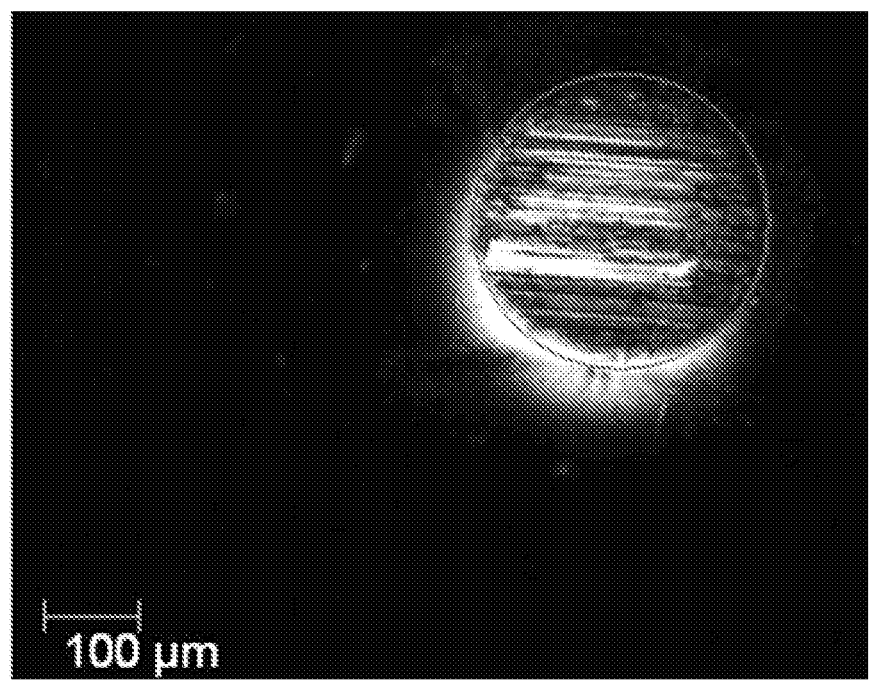
FIG. 17 illustrates a SEM image of a surface in accordance with various embodiments.
Figure 18:
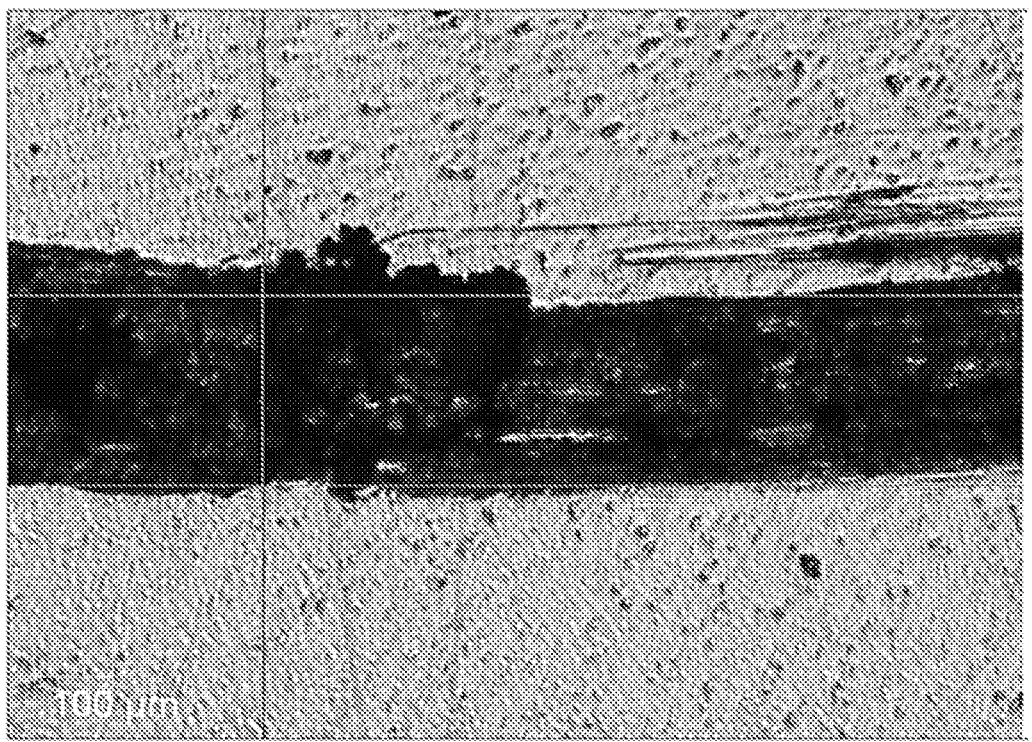
FIG. 18 illustrates a SEM image of a surface in accordance with various embodiments.
Figure 19:
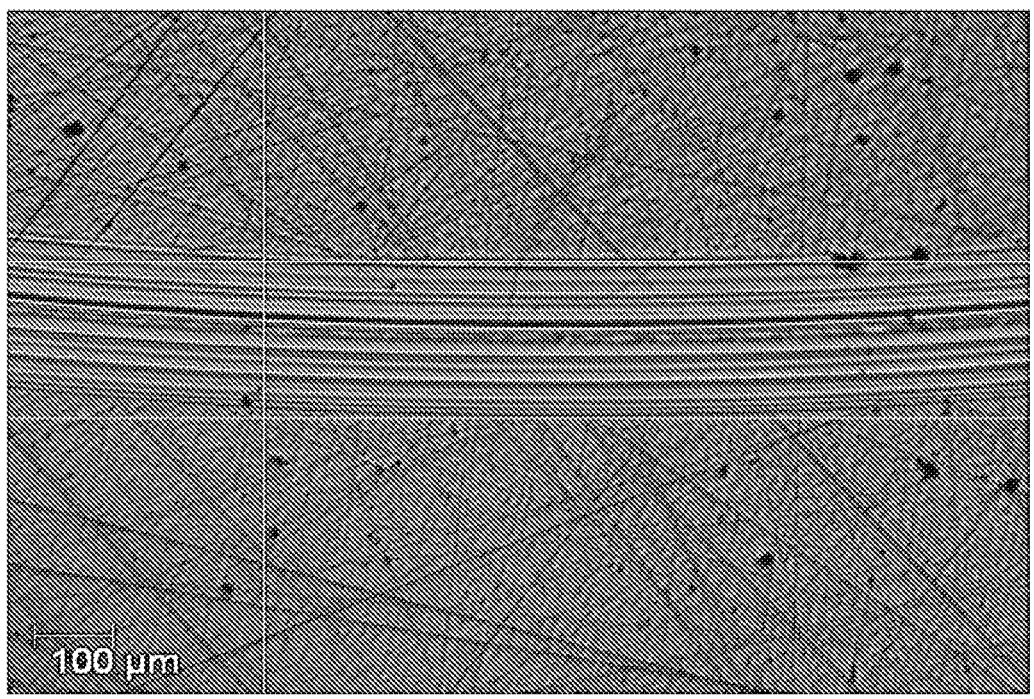
FIG. 19 illustrates a SEM image of a surface in accordance with various embodiments.

FIG. 14 illustrates a graph plotting the coefficient of friction and distance data generated by the ball-on-disk test using the 52100 steel ball static partner under a 10N load. The bare control sample instantly galled, and failed from the start. The coated sample, on the other hand, did not fail and exhibited a running coefficient of friction under 0.15. FIG. 15 illustrates a bar graph of the wear cap diameter of the 52100 steel ball static partner for the bare steel sample and the coated steel sample. FIG. 16 shows an SEM image of the 52100 steel ball static partner, where material transfer and galling to the static partner is shown for testing of the bare 465 steel disk. FIG. 17 shows an SEM image of the 52100 steel ball static partner with minor wear to the static partner for testing of the coated 465 steel sample. FIG. 18 shows an SEM image of the wear track formed on the bare 465 steel disk surface, the wear track demonstrating galling and material transfer. Notably, the damage shown in FIG. 18 occurred in less than 5 meters of contact, which indicates substantially instant failure. FIG. 19 show the wear track formed on the coated 465 steel disk after 850 meters of contact.

The samples having the carbon based coating demonstrated significant improvement in disk surface durability under high contact load for both 52100 steel and 7075 aluminum static partners. The carbon based coatings minimized material loss between the static partner and the disk surfaces. The bare 465 steel disk against the bare 52100 steel ball produces instant failure and galling, while addition of the carbon based coating provides a low friction interface with dramatic improvement in durability.

While the present disclosure discusses illustrative embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any embodiment may be utilized with all or a portion of any other embodiment, unless stated otherwise. While certain exemplary embodiments have been described and shown in the accompanying drawings, it is to be understood that such embodiments are merely illustrative of and not restrictive on the broad disclosure, and that this disclosure not be limited to the specific constructions and arrangements shown and described, since various other changes, combinations, omissions, modifications and substitutions, in addition to those set forth in the above paragraphs are possible. Those skilled in the art will appreciate that various adaptations and modifications of the just described embodiments can be configured without departing from the scope and spirit of the disclosure. Therefore, it is to be understood that, within the scope of the appended claims, the embodiments may be practiced other than as specifically described herein.

What is claimed is:

1. A carbon based coating comprising:
a uniform multilayer amorphous carbon thin film directly deposited on an aluminum substrate, the uniform multilayer amorphous carbon thin film comprising a first layer and a second layer,
wherein each of the first layer and the second layer comprises a middle portion having amorphous carbon and tetrahedral amorphous carbon at different ratios,
wherein the first layer and the second layer are at least partially melded into one another, and
wherein the uniform multilayer amorphous carbon thin film is a plasma assisted chemical vapor deposition (PACVD) film having a hardness of at least 60 GPa according to ASTM E2546.

2. The carbon based coating of claim 1, characterized in that the carbon based coating has a coefficient of friction value less than 0.10 under steady-state, un-lubricated, and ambient atmospheric conditions.

3. The carbon based coating of claim 1, wherein the uniform multilayer amorphous carbon thin film is deposited at a temperature from about 19° C. to about 204° C.

4. The carbon based coating of claim 1, characterized in that the carbon based coating has low material loss under high contact loads and a mating surface in contact with the carbon based coating has low material loss under high contact loads as measured in accordance with ASTM G77.

5. The carbon based coating of claim 1, characterized in that the carbon based coating has a coating surface wear rate less than 1.0E-03 mm3/N mm as measured in accordance with ASTM G99 using the aluminum substrate coated with the uniform multilayer amorphous carbon thin film.

6. The carbon based coating of claim 1, characterized in that the carbon based coating completely delaminates at a critical load value of greater than or equal to 19 N as measured in accordance with ASTM C1624 using the aluminum substrate coated with the carbon based coating.

7. The carbon based coating of claim 1, wherein at least a portion of the uniform multilayer amorphous carbon thin film is embedded beneath a surface of the aluminum substrate.

8. A method of producing a carbon based coating comprising:
depositing a first layer of a carbon based coating; and
depositing a second layer of the carbon based coating,
wherein the first layer and the second layer form a uniform multilayer amorphous carbon thin film directly on an aluminum substrate,
wherein a middle portion of the second layer comprises a middle portion having amorphous carbon and tetrahedral amorphous carbon at a different ratio than a middle portion of the first layer,
wherein the first layer and the second layer are at least partially melded into one another, and
wherein the uniform multilayer amorphous carbon thin film is a plasma assisted chemical vapor deposition (PACVD) film having a hardness of at least 60 GPa according to ASTM E2546.

9. A method for producing a carbon based coating on a surface comprising:
loading an aluminum substrate into a deposition chamber;
charging a first gas to plasma clean the aluminum substrate; and
charging at least a second gas to deposit the carbon based coating directly on a surface of the aluminum substrate, the second gas comprising a carbon based gas;
wherein the carbon based coating comprises a uniform multilayer amorphous carbon thin film, the uniform multilayer amorphous carbon thin film comprising at least a first layer and a second layer,
wherein each of the first layer and the second layer comprises a middle portion having amorphous carbon and tetrahedral amorphous carbon at different ratios,
wherein the first layer and the second layer are at least partially melded into one another; and
wherein the uniform multilayer amorphous carbon thin film is a plasma assisted chemical vapor deposition (PACVD) film having a hardness of at least 60 GPa according to ASTM E2546.

10. A substrate with a carbon based coating produced by:
loading an aluminum substrate into a deposition chamber;
charging a first gas to plasma clean the aluminum substrate; and
charging a second gas to deposit the carbon based coating directly on a surface of the aluminum substrate, the second gas comprising a carbon based gas;
wherein the carbon based coating comprises a uniform multilayer amorphous carbon thin film, the uniform multilayer amorphous carbon thin film comprising at least a first layer and a second layer, wherein each of the first layer and the second layer comprises a middle portion having amorphous carbon and tetrahedral amorphous carbon at different ratios, and wherein the first layer and the second layer are at least partially melded into one another; and wherein the uniform multilayer amorphous carbon thin film is a plasma assisted chemical vapor deposition (PACVD) film having a hardness of at least 60 GPa according to ASTM E2546.

\* \* \* \* \*